USO12514066B2

(12) United States Patent
Yang et al.

(10) Patent No.: US 12,514,066 B2
(45) Date of Patent: Dec. 30, 2025

(54) DISPLAY DEVICE

(71) Applicant: Samsung Display Co., LTD., Yongin-si (KR)

(72) Inventors: Gi Hoon Yang, Hwaseong-si (KR); Tae Min Kim, Hwaseong-si (KR); Bong Sung Seo, Suwon-si (KR); Dong Geun Shin, Pyeongtaek-si (KR); Seul Gee Lee, Seoul (KR); Ho Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 728 days.

(21) Appl. No.: 17/861,917

(22) Filed: Jul. 11, 2022

(65) Prior Publication Data
US 2023/0165062 A1 May 25, 2023

(30) Foreign Application Priority Data

Nov. 25, 2021 (KR) .................... 10-2021-0164630

(51) Int. Cl.
*H01L 27/32* (2006.01)
*H01L 51/52* (2006.01)
(Continued)

(52) U.S. Cl.
CPC ......... *H10K 59/122* (2023.02); *H10K 59/873* (2023.02); *H10K 59/879* (2023.02); *H10K 59/38* (2023.02); *Y10T 428/24942* (2015.01)

(58) Field of Classification Search
CPC .. H10K 59/122; H10K 50/844; H10K 50/858; H10K 59/38; Y10T 428/24942
See application file for complete search history.

(56) References Cited

U.S. PATENT DOCUMENTS 10,852,580 B2   12/2020  Jung et al.
11,650,441 B2    5/2023  Baek et al.
(Continued)

FOREIGN PATENT DOCUMENTS

EP           3451052 A1 *  3/2019  ....... G02F 1/133512
KR    10-2019-0027006 A    3/2019
(Continued)

OTHER PUBLICATIONS

[NPL-2] Beliaev et al. "Optical, structural and composition properties of silicon nitride films deposited by reactive radio-frequency sputtering, low pressure and plasma-enhanced chemical vapor deposition"; Thin Solid Films, 763 (2022). (Year: 2022).*
(Continued)

*Primary Examiner* — Donald M Flores, Jr.
(74) *Attorney, Agent, or Firm* — Womble Bond Dickinson (US) LLP

(57) ABSTRACT

A display device includes a display portion including a non-light emitting area and a light emitting area adjacent to the non-light emitting area; and a color conversion portion disposed on the display portion. The display portion includes a base portion, and a light emitting device disposed on the base portion in the light emitting area, and the color conversion portion includes wavelength conversion patterns disposed on the light emitting device, an inorganic insulating layer disposed on the wavelength conversion patterns, a first organic insulating layer disposed on the inorganic insulating layer, a color filter layer disposed on the first organic insulating layer, and a second organic insulating layer disposed on the color filter layer.

19 Claims, 19 Drawing Sheets

(51) Int. Cl.
    *H10K 59/122* (2023.01)
    *H10K 59/80* (2023.01)
    *H10K 59/38* (2023.01)

(56) References Cited

U.S. PATENT DOCUMENTS

| | | | |
|---|---|---|---|
| 11,910,685 B2 | 2/2024 | Lee | |
| 2015/0077966 A1* | 3/2015 | Bessho | H10H 20/856 362/19 |
| 2016/0190328 A1* | 6/2016 | Yang | G02F 1/1368 257/43 |
| 2019/0121176 A1* | 4/2019 | Lee | H10K 59/879 |
| 2019/0219875 A1* | 7/2019 | Jung | G02F 1/133617 |
| 2020/0081173 A1* | 3/2020 | Tak | G02B 6/0043 |
| 2020/0227485 A1* | 7/2020 | Park | H10K 59/878 |
| 2022/0302419 A1 | 9/2022 | Yang et al. | |

FOREIGN PATENT DOCUMENTS

| | | |
|---|---|---|
| KR | 10-2019-0047592 A | 5/2019 |
| KR | 10-2020-0032294 | 3/2020 |
| KR | 10-2021-0142038 A | 11/2021 |
| KR | 10-2022-0033579 | 3/2022 |
| KR | 10-2022-0131401 | 9/2022 |

OTHER PUBLICATIONS

[NPL-1] "Refractive Index of Si3N4, Silicon Nitride, SiN, SiON"; Filmetrics, Inc.; (accessed Mar. 13, 2025); <https://www.filmetrics.com/refractive-index-database/Si3N4/Silicon-Nitride-SiN-SiON#:~:text=For%20a%20typical%20sample%20of,refractive%20index%20and%20extinction%20coefficients.>. (Year: 2025).*

[NPL-3] Yang et al. "The structures and properties of hydrogen silsesquioxane (HSQ) films produced by thermal curing"; J. Mater. Chem., 2002, 12, pp. 1138-1141. (Year: 2002).*

Korean Office Action dated Jul. 24, 2025, issued in corresponding Korean Patent Application No. 10-2021-0164630 (8 pages).

* cited by examiner

DISPLAY DEVICE

CROSS-REFERENCE TO RELATED APPLICATION

This application claims priority to and benefits of Korean Patent Application No. 10-2021-0164630 under 35 U.S.C. § 119, filed on Nov. 25, 2021, in the Korean Intellectual Property Office (KIPO), the contents of which are incorporated herein by reference.

BACKGROUND

1. Technical Field

The disclosure relates to a display device.

2. Description of the Related Art

The importance of display devices is gradually increasing with the development of multimedia. In response to this, various display devices such as a liquid crystal display device (LCD) and an organic light emitting diode display device (OLED) have been developed.

Among the display devices, a self-light emitting display device includes a self-light emitting element, for example, an organic light emitting element. The self-light emitting element may include two opposing electrodes and an emission layer interposed therebetween. In case that the self-light emitting element is the organic light emitting element, electrons and holes provided from the two electrodes combine (or recombine) in the emission layer to generate exciton, the generated exciton changes from an excited state to a ground state, and light may be emitted.

The self-light emitting display device that does not require a light source, such as a backlight unit, has low power consumption and may be configured in a lightweight and thin shape, and has also attracted attention as a next-generation display device because of its high quality characteristics such as a wide viewing angle, high luminance and contrast, and a fast response speed.

SUMMARY

Aspects of the disclosure provide a display device capable of improving external light reflection and simplifying a film structure.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, there is provided a display device, the display device comprises a display portion including a non-light emitting area and a light emitting area adjacent to the non-light emitting area; and a color conversion portion disposed on the display portion. The display portion includes a base portion, and a light emitting device disposed on the base portion in the light emitting area, and the color conversion portion includes wavelength conversion patterns disposed on the light emitting device, an inorganic insulating layer disposed on the wavelength conversion patterns, a first organic insulating layer disposed on the inorganic insulating layer, a color filter layer disposed on the first organic insulating layer, and a second organic insulating layer disposed on the color filter layer.

The inorganic insulating layer may have a refractive index greater than a refractive index of the first organic insulating layer.

The refractive index of the inorganic insulating layer may be in a range of about 1.9 to about 2.2.

The refractive index of the first organic insulating layer may be in a range of about 1.3 to about 1.8.

The second organic insulating layer may have a thickness greater than a thickness of the first organic insulating layer.

The thickness of the first organic insulating layer may be in a range of about 100 nm to about 500 nm, and the thickness of the second organic insulating layer may be in a range of about 3000 nm to about 10000 nm.

The first organic insulating layer may include a first base material, and the second organic insulating layer may include a second base material.

The first base material and the second base material each may include

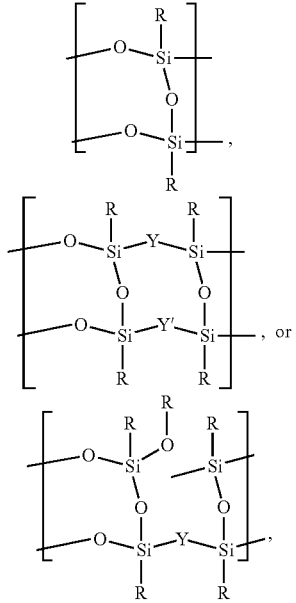

where Y may be O, NR, or $(SiO_{2/3}R)_{4+2n}O$, n being an integer greater than or equal to 0, and R is H or F.

The first base material and the second base material may include a same material.

The first base material and the second base material may be different, R of the first base material may be F, and R of the second base material may be H.

The first organic insulating layer may include a first filler, the second organic insulating layer may include a second filler, and the first filler and the second filler each may include at least one of a hollow silica, a hollow acrylate polymer, a hollow vinyl polymer, a hollow epoxy polymer, and $TiO_2$.

The second filler may have a size larger than a size of the first filler.

The second filler may have a diameter in a range of about 50 nm to about 6000 nm, and the first filler may have a diameter in a range of about 50 nm to about 500 nm.

The first filler and the second filler each may have a content of 50 wt % or less.

According to another aspect of the disclosure, there is provided a display device, the display device comprises a display portion including a non-light emitting area and light emitting areas adjacent to the non-light emitting area, the light emitting area including a first light emitting area, a second light emitting area, and a third light emitting area; and a color conversion portion disposed on the display portion The display portion includes a base portion, and a light emitting device disposed on the base portion in the light emitting area, and the color conversion portion includes a first wavelength conversion pattern overlapping the first light emitting area in a plan view, a second wavelength conversion pattern overlapping the second light emitting area in a plan view, and a light transmission pattern overlapping the third light emitting area in a plan view, a first inorganic insulating layer disposed on the first wavelength conversion pattern, the second wavelength conversion pattern, and the light transmission pattern, a first organic insulating layer disposed on the first inorganic insulating layer, a color filter layer disposed on the first organic insulating layer, and a second organic insulating layer disposed on the color filter layer, the first inorganic insulating layer has a refractive index greater than a refractive index of the first organic insulating layer, and the first wavelength conversion pattern, the second wavelength conversion pattern, and the light transmission pattern are disposed on the light emitting device.

The color filter layer may include a yellow color filter.

The yellow color filter may not overlap the third light emitting area in a plan view.

The second organic insulating layer may directly contact the first organic insulating layer in an area overlapping the third light emitting area in a plan view.

A thickness of at least part of the second organic insulating layer overlapping the third light emitting area in a plan view may be greater than a thickness of at least part of the second organic insulating layer overlapping the first and second light emitting areas in a plan view.

The display device may further include a second inorganic insulating layer. The first inorganic insulating layer may not overlap the third light emitting area in a plan view, the first inorganic insulating layer and the second inorganic insulating layer may be disposed on a same layer in an area overlapping the third light emitting area in a plan view, and the second inorganic insulating layer may have a refractive index smaller than a refractive index of the first inorganic insulating layer.

Detailed contents of other example embodiments are described in a detailed description and are illustrated in the accompanying drawings.

According to example embodiments of the disclosure, a display device capable of improving external light reflection and simplifying film structures.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
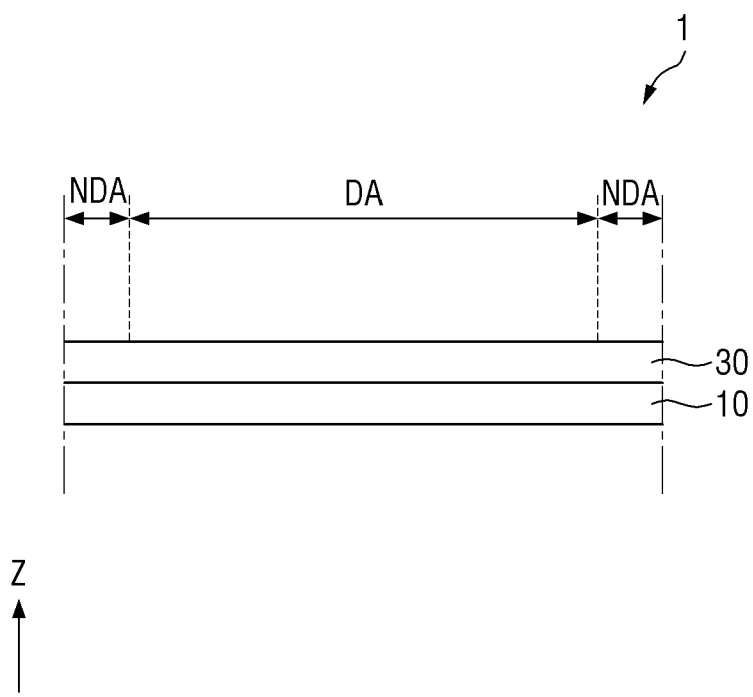
FIG. 1 is a schematic cross-sectional view illustrating a stacked structure of a display device according to an example embodiment.

Advantages and features of the disclosure and methods of achieving the same will become apparent with reference to the embodiments described below in detail in conjunction with the accompanying drawings. However, the disclosure is not limited to embodiments to be described below, but may be implemented in various different forms, these example embodiments will be provided only in order to make the disclosure more complete and allow one of ordinary skill in the art to which the disclosure pertains to recognize the scope of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic cross-sectional view illustrating a schematic stacked structure of a display device according to an embodiment.

Referring to FIG. 1, a display device 1 may be applied to various electronic devices such as small and medium-sized electronic equipment such as tablet personal computers (PCs), smartphones, car navigation systems, cameras, central information displays (CIDs) provided in automobiles, wristwatch-type electronic devices, personal digital assistants (PDAs), portable multimedia players (PMPs), and game machines, medium and large-sized electronic equipment such as televisions, external billboards, monitors, PCs, laptop computers, and the like. These are presented only as examples, and may also be employed in other electronic devices without departing from the concept of the disclosure.

The display device 1 may include a display area DA displaying an image and a non-display area NDA that does not display an image. In some embodiments, the non-display area NDA may be positioned around the display area DA and surround the display area DA. An image displayed in the display area DA may be viewed by a user in a direction to which an arrow of the drawing is directed in a third direction Z.

A schematic stacked structure of the display device 1 will be described. In some embodiments, as illustrated in FIG. 1, the display device 1 may include a display portion 10 and a color conversion portion 30 disposed on the display portion 10.

The display portion 10 may include an element and circuits for displaying an image, for example, a pixel circuit such as a switching element, a pixel defining layer defining a light emitting area and a non-light emitting area to be described below in the display area DA, and a self-light emitting element. In an embodiment, the self-light emitting element may include at least one of an organic light-emitting diode (LED), a quantum dot light emitting diode, an inorganic material-based micro light emitting diode (e.g., a micro LED), and an inorganic material-based light emitting diode (e.g., a nano LED) having a nano size. Hereinafter, for convenience of explanation, a case where the self-light emitting element is an organic light emitting element will be described by way of example.

The color conversion portion 30 may be positioned on the display portion 10. In some embodiments, the color conversion portion 30 may include a color conversion pattern for converting a color of incident light. In some embodiments, the color conversion portion 30 may include at least one of a color filter and a wavelength conversion pattern, as the color conversion pattern. In some embodiments, the color conversion portion 30 may also include both the color filter and the wavelength conversion pattern.

Figure 2:
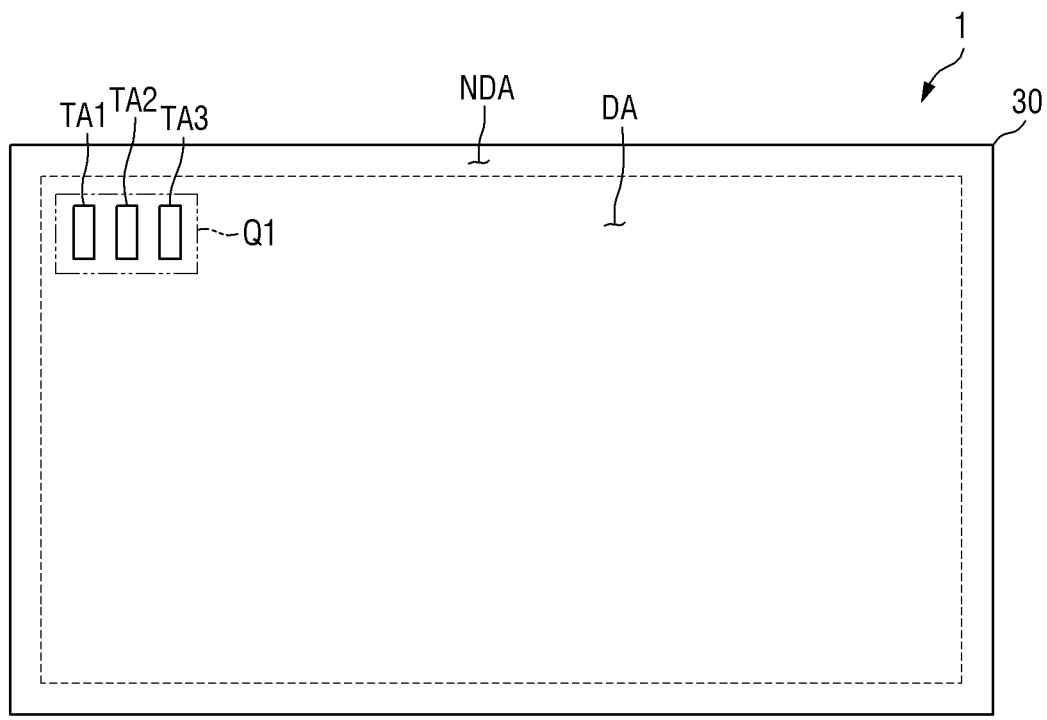
FIG. 2 is a schematic plan view of the display device according to an example embodiment.
Figure 3:
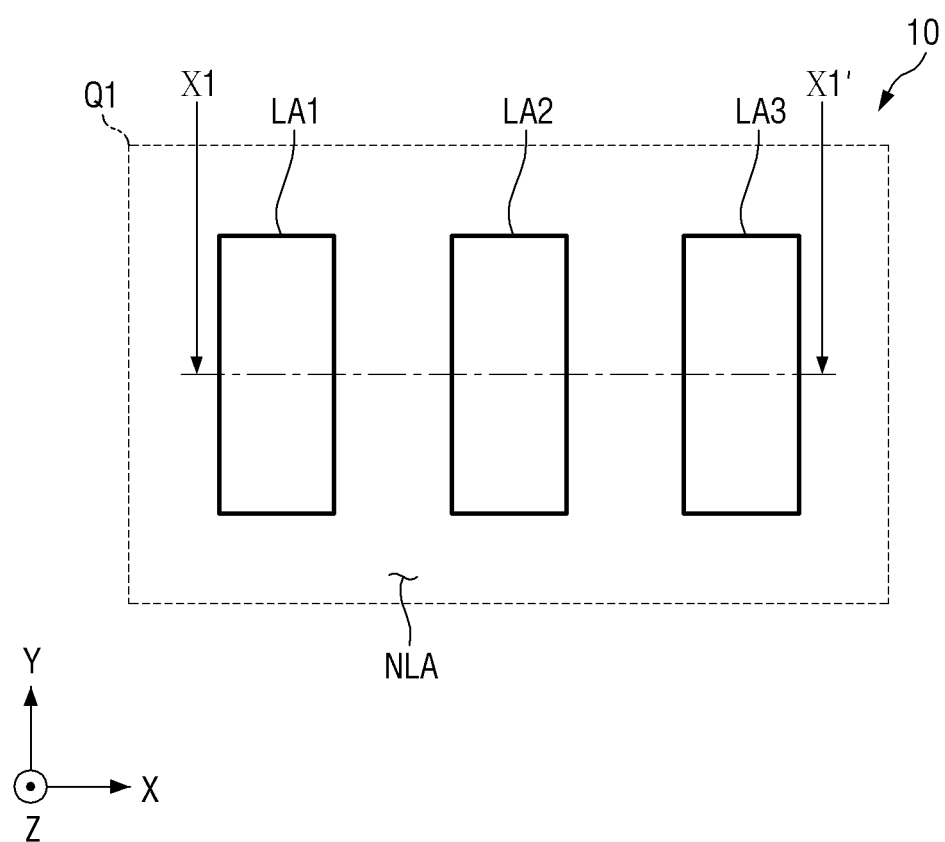
FIG. 3 is a schematic enlarged plan view of a portion Q1 of FIG. 2, and more specifically, is a schematic plan view of a display portion included in the display device of FIG. 2.
Figure 4:
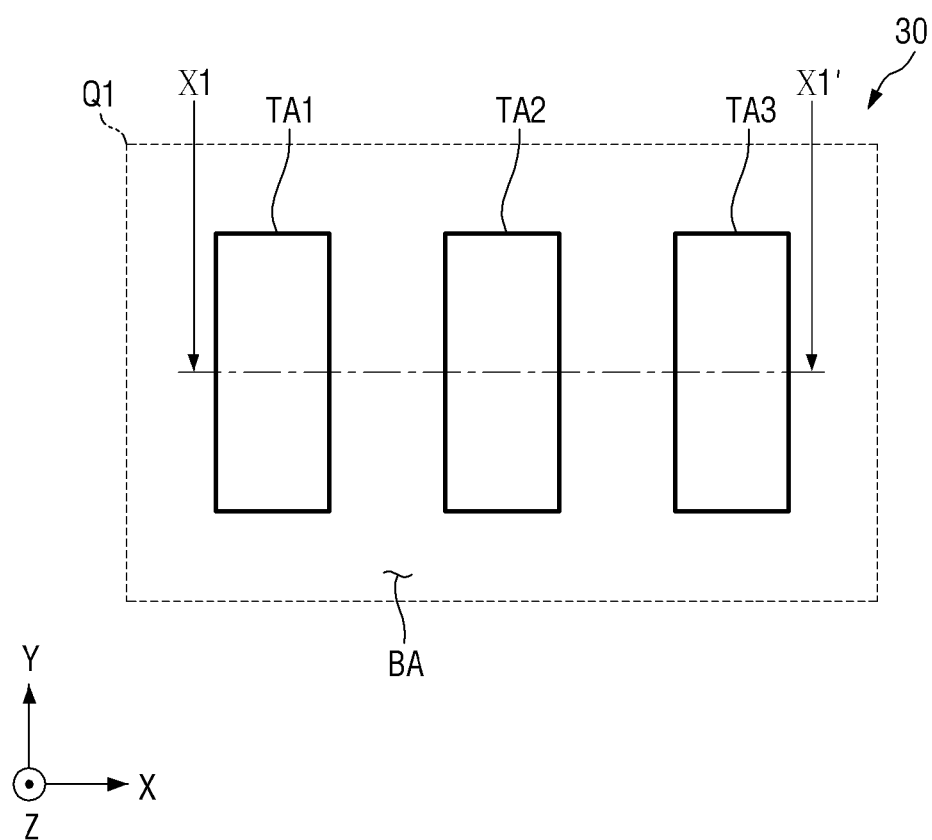
FIG. 4 is a schematic enlarged plan view of a portion Q1 of FIG. 2, and more specifically, is a schematic plan view of a color conversion portion included in the display device of FIG. 2.
Figure 5:
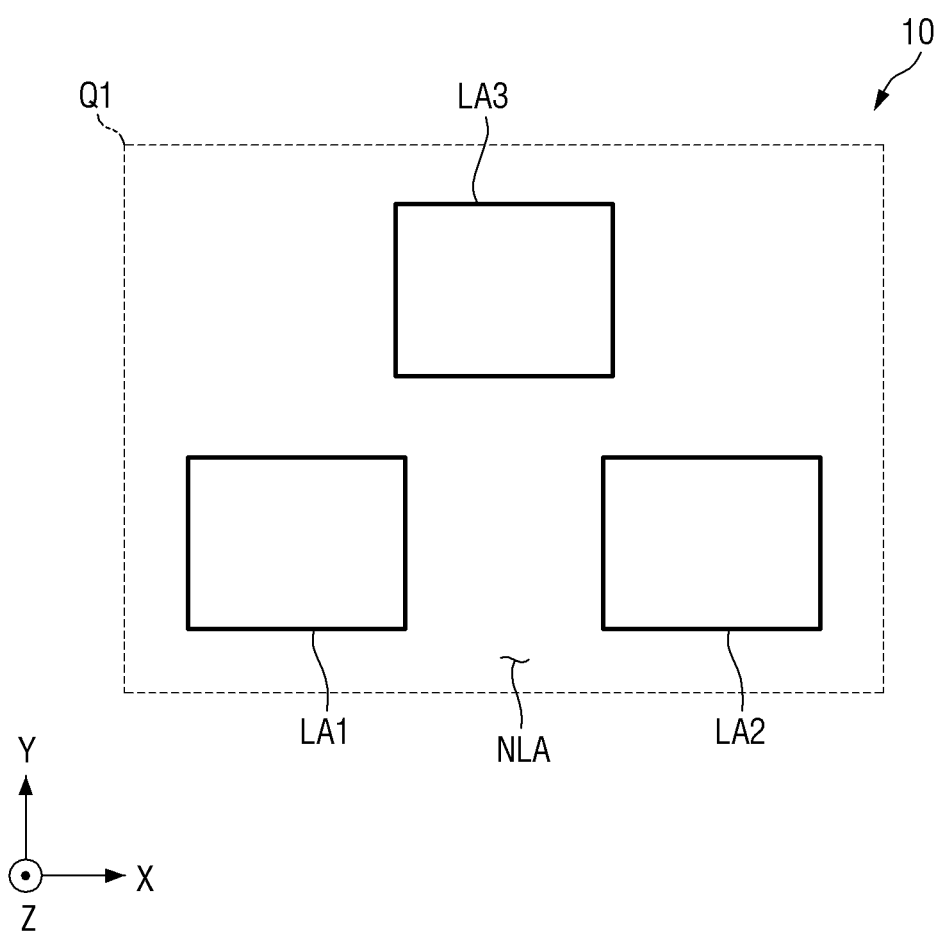
FIG. 5 is a schematic plan view illustrating a modified example of FIG. 3.
Figure 6:
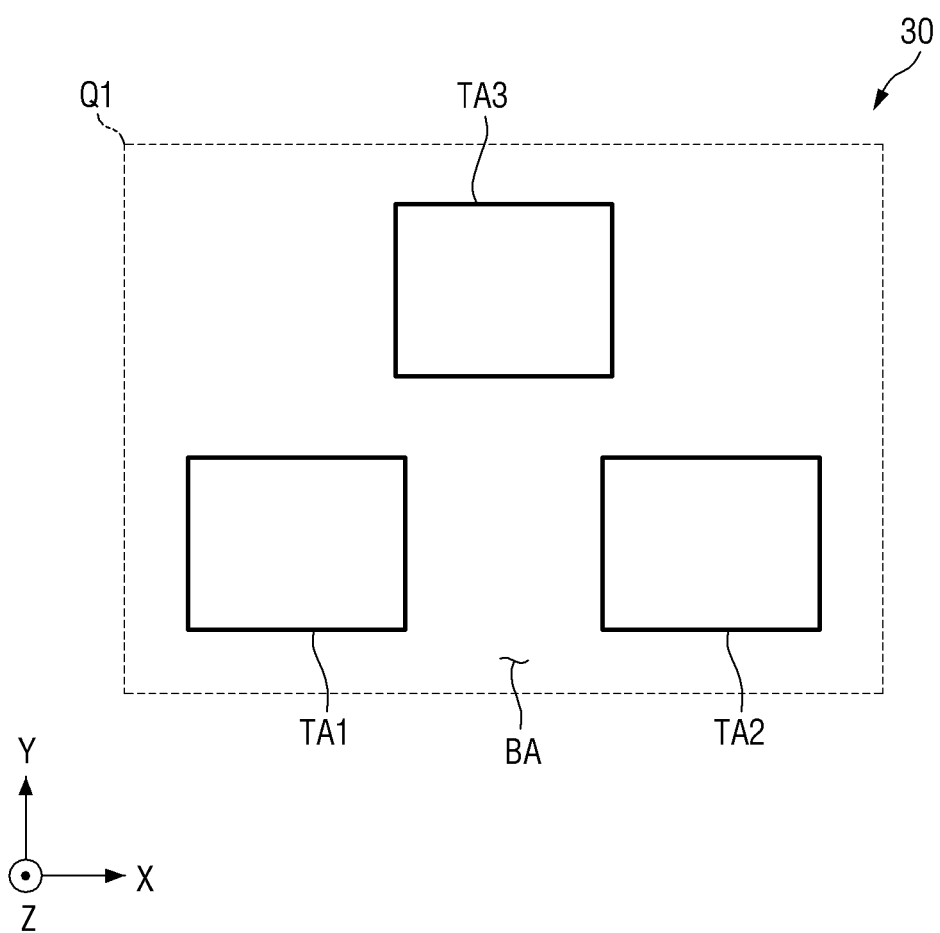
FIG. 6 is a schematic plan view illustrating a modified example of FIG. 4.

FIG. 2 is a schematic plan view of the display device according to an embodiment. FIG. 3 is a schematic enlarged plan view of portion Q1 of FIG. 2, and more specifically, is a schematic plan view of a display portion included in the display device of FIG. 2. FIG. 4 is a schematic enlarged plan view of portion Q1 of FIG. 2, and more specifically, is a schematic plan view of a color conversion portion included in the display device of FIG. 2. FIG. 5 is a schematic plan view illustrating a modified example of FIG. 3. FIG. 6 is a schematic plan view illustrating a modified example of FIG. 4.

Referring to FIGS. 1 and 2 to 6, in some embodiments, as illustrated in FIG. 2, the display device 1 may have a rectangular shape in a plan view. The display device 1 may include long sides extending in a first direction X and short sides extending in a second direction Y intersecting the first direction X. A corner where each side of the display device 1 meets may have a right angle, but the disclosure is not limited thereto. The shape of the display device 1 in a plan view is not limited to the illustrated one, and a circular shape or other shapes may also be applied.

As illustrated in FIG. 3, light emitting areas and a non-light emitting area NLA may be defined in the display portion 10 in the display area DA.

In some embodiments, a first light emitting area LA1, a second light emitting area LA2, and a third light emitting area LA3 may be defined in the display area DA of the display portion 10. The first light emitting area LA1, the second light emitting area LA2, and the third light emitting area LA3 may be areas from which light generated by the light emitting element of the display portion 10 is emitted to the outside of the display portion 10, and the non-light emitting area NLA may be an area in which light is not emitted to the outside of the display portion 10. In some embodiments, the non-light emitting area NLA may surround each of the first light emitting area LA1, the second light emitting area LA2, and the third light emitting area LA3 in the display area DA.

In some embodiments, the light emitted to the outside from the first light emitting area LA1, the second light emitting area LA2, and the third light emitting area LA3 may be light of a third color. In some embodiments, the light of the third color may be blue light, and may have a peak wavelength in a range of about 440 nm to about 480 nm. The peak wavelength means a wavelength at which light has maximum intensity.

In some embodiments, the first light emitting area LA1, the second light emitting area LA2, and the third light emitting area LA3 may form a group, and groups may be defined in the display area DA.

In some embodiments, as illustrated in FIG. 3, the first light emitting area LA1, the second light emitting area LA2, and the third light emitting area LA3 may be sequentially positioned in the first direction X. In some embodiments, the first light emitting area LA1, the second light emitting area LA2, and the third light emitting area LA3 may form a group in the display area DA and may be repeatedly disposed in the first direction X and the second direction Y.

However, the disclosure is not limited thereto, and the arrangement of the first light emitting area LA1, the second light emitting area LA2, and the third light emitting area LA3 may be variously changed. For example, as illustrated in FIG. 5, the first light emitting area LA1 and the second light emitting area LA2 may be adjacent to each other in the first direction X, and the third light emitting area LA3 may also be positioned at a side of the first light emitting area LA1 and the second light emitting area LA2 in the second direction Y.

Hereinafter, a case in which the first light emitting area LA1, the second light emitting area LA2, and the third light emitting area LA3 are disposed as illustrated in FIG. 3 will be described as an example.

As illustrated in FIG. 4, light transmitting areas and a light blocking area BA may be defined in the color conversion portion 30 in the display area DA. The light transmitting areas may be areas in which light emitted from the display portion 10 transmits through the color conversion portion 30 and is provided to the outside of the display device 1. The light blocking area BA may be an area through which the light emitted from the display portion 10 does not transmit.

In some embodiments, a first light transmitting area TA1, a second light transmitting area TA2, and a third light transmitting area TA3 may be defined in the color conversion portion 30.

The first light transmitting area TA1 may correspond to or overlap the first light emitting area LA1. Similarly, the second light transmitting area TA2 may correspond to or overlap the second light emitting area LA2, and the third light transmitting area TA3 may correspond to or overlap the third light emitting area LA3.

In some embodiments, in case that the first light emitting area LA1, the second light emitting area LA2, and the third light emitting area LA3 are sequentially positioned in the first direction X as illustrated in FIG. 3, the first light transmitting area TA1, the second light transmitting area TA2, and the third light transmitting area TA3 may also be sequentially positioned in the first direction X as illustrated in FIG. 4.

As another example, as illustrated in FIG. 5, in case that the first light emitting area LA1 and the second light emitting area LA2 are adjacent to each other in the first direction X, and the third light emitting area LA3 is positioned at a side of the first light emitting area LA1 and the second light emitting area LA2 in the second direction Y, the first light transmitting area TA1 and the second light transmitting area TA2 may be adjacent to each other in the first direction X, and the third light transmitting area TA3 may be positioned at a side of the first light transmitting area TA1 and the second light transmitting area TA2 in the second direction Y as illustrated in FIG. 6.

In some embodiments, the light of the third color provided from the display portion 10 may transmit through the first light transmitting area TA1, the second light transmitting area TA2, and the third light transmitting area TA3 and be provided to the outside of the display device 1. In case that the light emitted from the first light transmitting area TA1 to the outside of the display device 1 is referred to as first emitted light, the light emitted from the second light transmitting area TA2 to the outside of the display device 1 is referred to as second emitted light, and the light emitted from the third light transmitting area TA3 to the outside of the display device 1 is referred to as third emitted light, the first emitted light may be light of a first color, the second emitted light may be light of a second color different from the first color, and the third emitted light may be the light of the third color. In some embodiments, the light of the third color may be the blue light having the peak wavelength in a range of about 440 nm to about 480 nm as described above, and the light of the first color may be red light having a peak wavelength in a range of about 610 nm to about 650 nm. The light of the second color may be green light having a peak wavelength in a range of about 510 nm to about 550 nm.

The light blocking area BA may be positioned around the first light transmitting area TA1, the second light transmitting area TA2, and the third light transmitting area TA3 of the color conversion portion 30 in the display area DA. In some embodiments, the light blocking area BA may surround the first light transmitting area TA1, the second light transmitting area TA2, and the third light transmitting area TA3. The light blocking area BA may also be positioned in the non-display area NDA of the display device 1.

Hereinafter, the structure of the display device 1 will be described in more detail.

Figure 7:
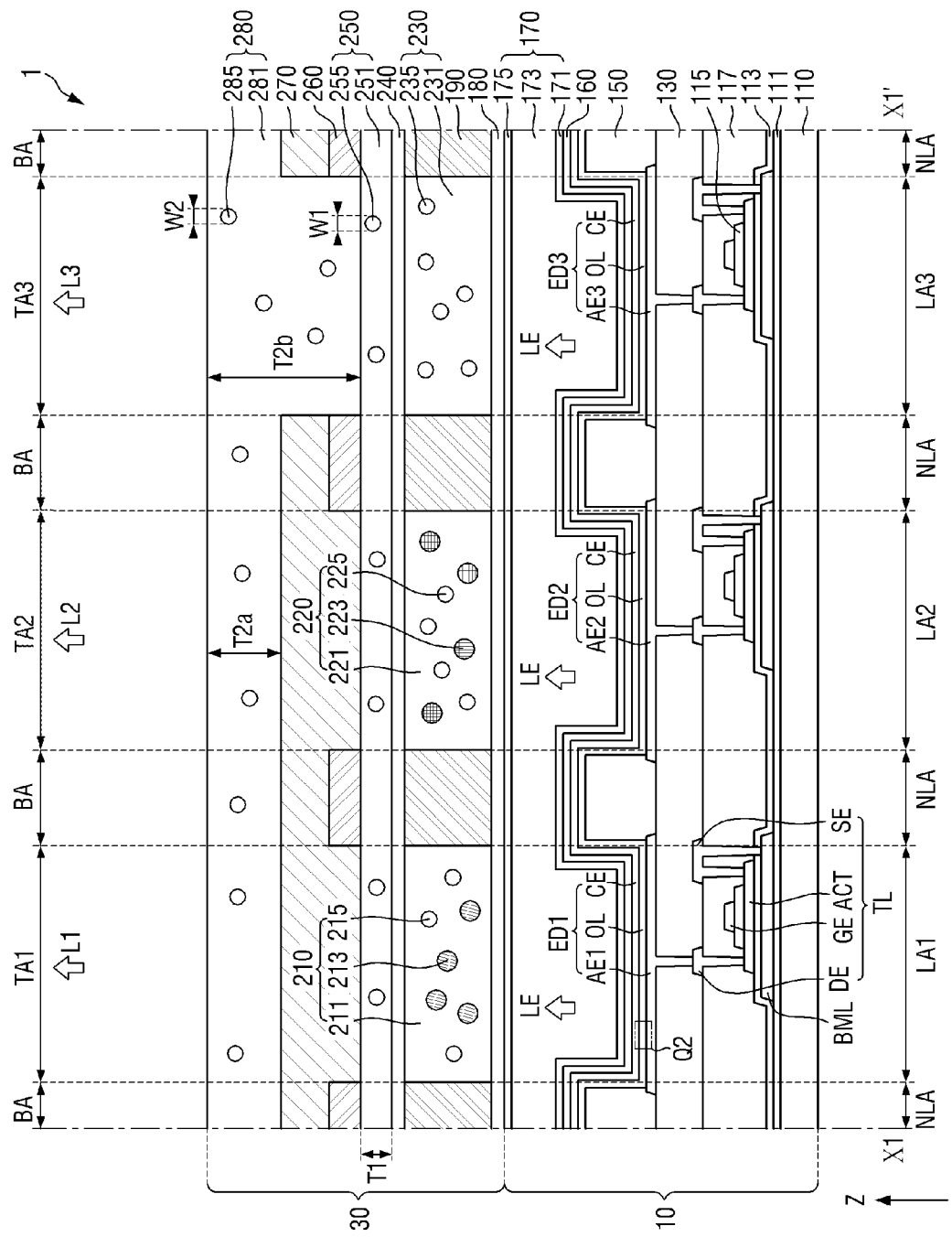
FIG. 7 is a schematic cross-sectional view of a display device according to an example embodiment taken along line X1-X1' of FIGS. 3 and 4.
Figure 8:
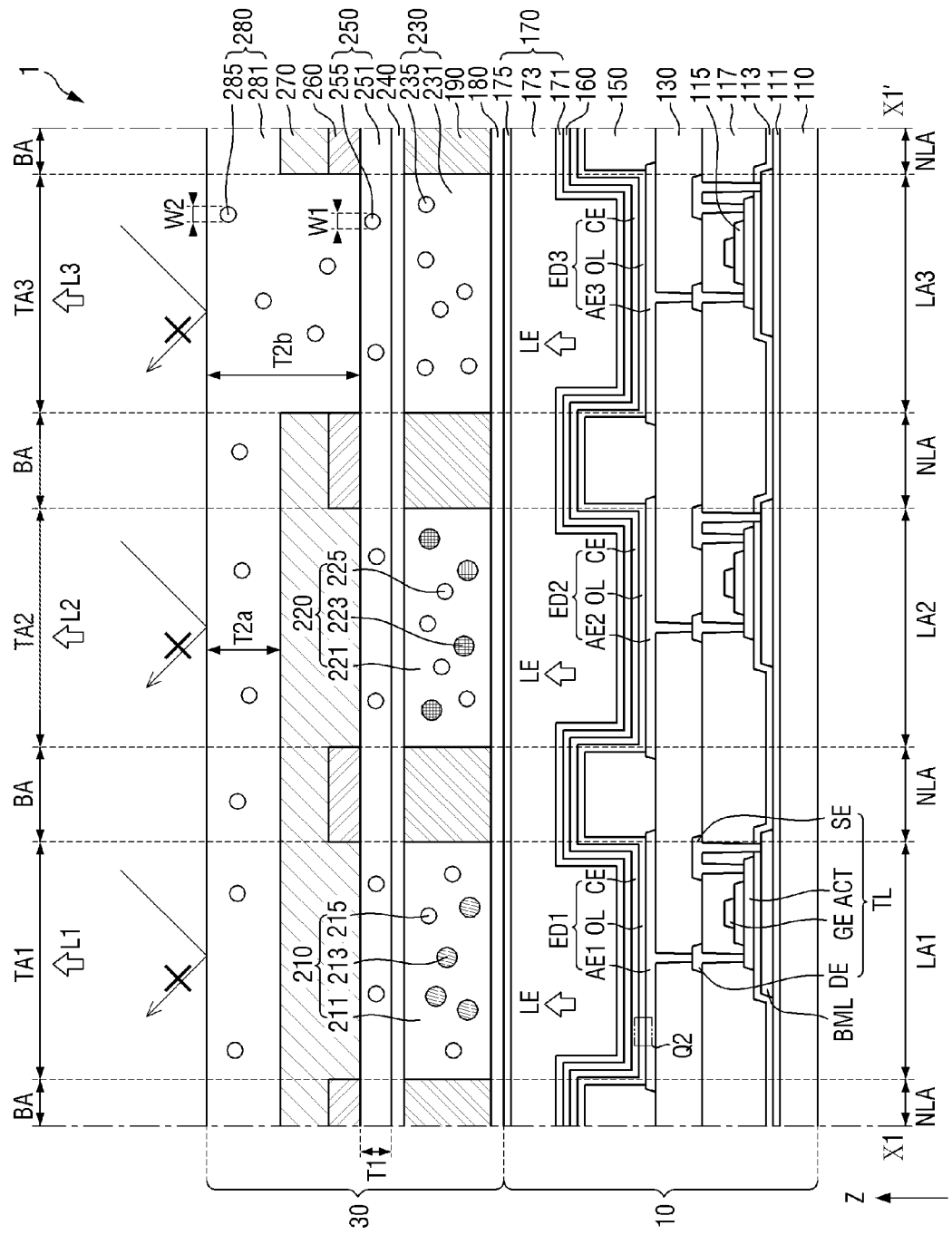
FIG. 8 is a schematic cross-sectional view illustrating an improvement in external light reflection of a display device according to an example embodiment.
Figure 9:
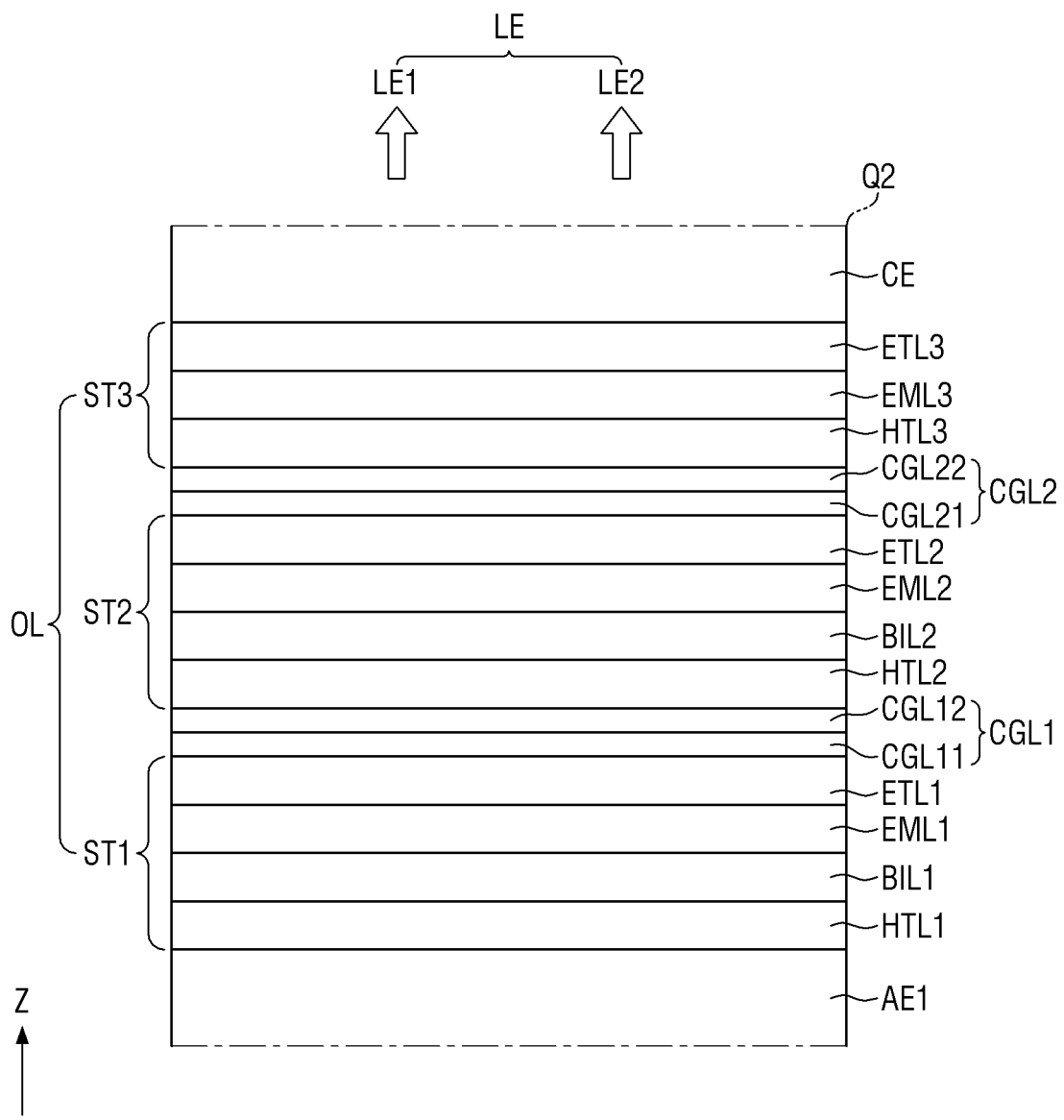
FIG. 9 is a schematic enlarged cross-sectional view of portion Q2 of FIG. 7.
Figure 10:
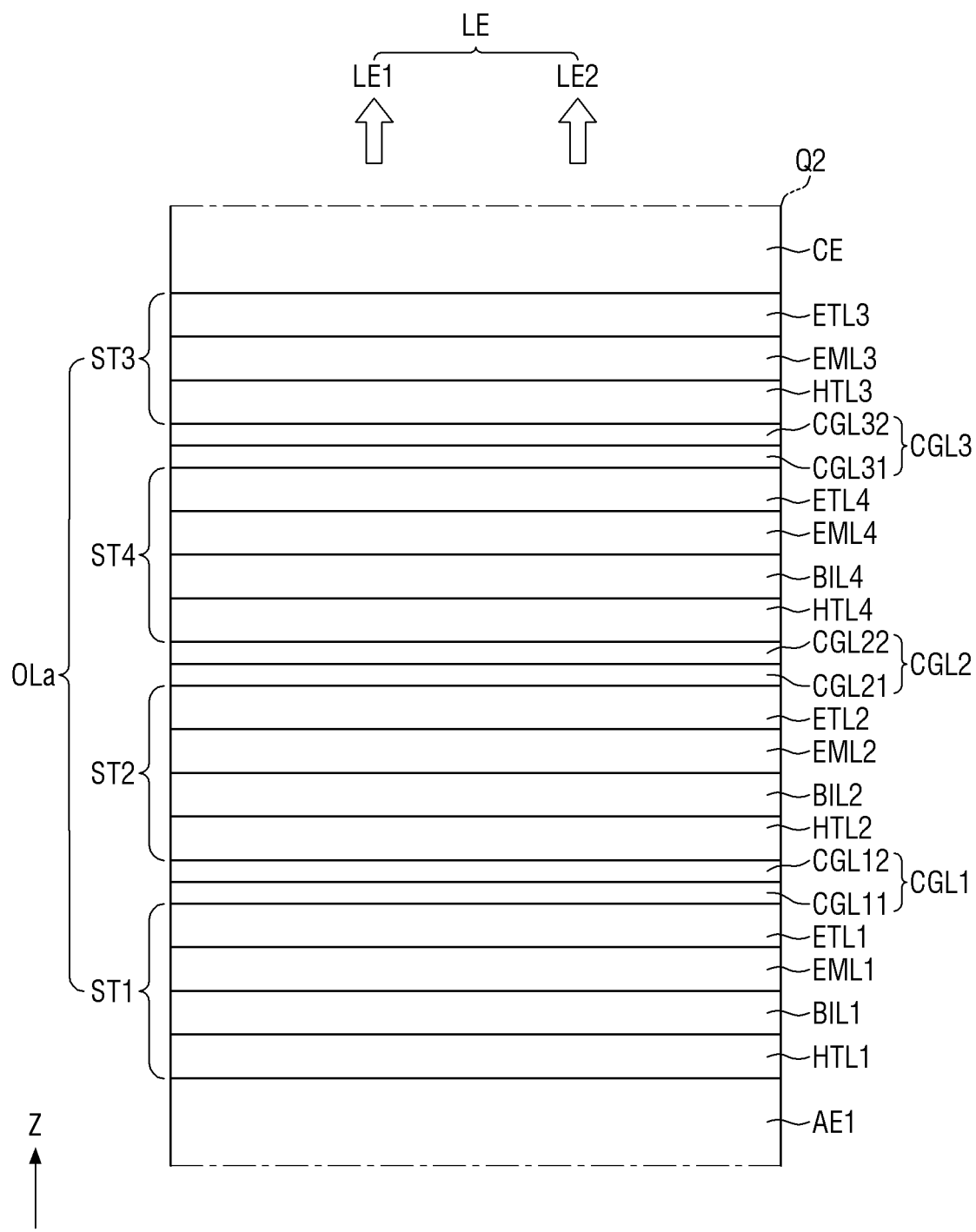
FIG. 10 is a schematic cross-sectional view illustrating a modified example of a structure illustrated in FIG. 9.

FIG. 7 is a schematic cross-sectional view of a display device according to an embodiment taken along line X1-X1' of FIGS. 3 and 4. FIG. 8 is a schematic cross-sectional view illustrating an improvement in external light reflection of a display device according to an embodiment. FIG. 9 is a schematic enlarged cross-sectional view of portion Q2 of FIG. 7. FIG. 10 is a schematic cross-sectional view illustrating a modified example of a structure illustrated in FIG. 9.

Referring further to FIGS. 1 to 6 and 7 to 10, the display device 1 may include the display portion 10 and the color conversion portion 30 as described above.

Hereinafter, the display portion 10 will be described.

A base portion 110 may be made of (or include) a light-transmitting material. In some embodiments, the base portion 110 may be a glass substrate or a plastic substrate. In case that the base portion 110 is the plastic substrate, the base portion 110 may have flexibility.

As described above, in some embodiments, the light emitting areas LA1, LA2, and LA3 and the non-light emitting area NLA may be defined in the base portion 110 in the display area DA.

A buffer layer 111 may be further positioned on the base portion 110. The buffer layer 111 may be disposed on the base portion 110 and may be disposed in the display area DA and the non-display area NDA. The buffer layer 111 may block foreign substances or moisture penetrating through the base portion 110. For example, the buffer layer 111 may include an inorganic material such as $SiO_2$, $SiN_x$, or SiON, and may be formed as a single layer or multiple layers.

A lower light blocking pattern BML may be positioned on the buffer layer 111. The lower light blocking pattern BML may block external light or light from the light emitting element from flowing into a semiconductor layer ACT to be described below, thereby preventing leakage current from being generated by light or reducing the leakage current in a thin-film transistor TL to be described below.

In some embodiments, the lower light blocking pattern BML may be formed of a material that blocks light and has conductivity. For example, the lower light blocking pattern BML may include a single material among metals such as silver (Ag), nickel (Ni), gold (Au), platinum (Pt), aluminum (Al), copper (Cu), molybdenum (Mo), titanium (Ti), and neodymium (Nd), or an alloy thereof. In some embodiments, the lower light blocking pattern BML may have a single layer or multilayer structure. For example, in case that the lower light blocking pattern BML has the multilayer structure, the lower light blocking pattern BML may be a stacked structure of titanium (Ti)/copper (Cu)/indium tin oxide (ITO) or a stacked structure of titanium (Ti)/copper (Cu)/aluminum oxide ($Al_2O_3$), but is not limited thereto.

In some embodiments, lower light blocking patterns BML may be provided to correspond to each semiconductor layer ACT and may overlap the semiconductor layer ACT. In some embodiments, a width of the lower light blocking pattern BML may be wider than a width of the semiconductor layer ACT.

In some embodiments, the lower light blocking pattern BML may also be a portion of a data line, a power supply line, or a wiring electrically connecting a thin-film transistor (not illustrated) and a thin-film transistor TL illustrated in the drawing to each other. In some embodiments, the lower light blocking pattern BML may be formed of a material having a lower resistance than a second conductive layer or a source electrode SE and a drain electrode DE included in the second conductive layer.

A first insulating layer 113 may be positioned on the lower light blocking pattern BML. In some embodiments, the first insulating layer 113 may be positioned in the display area DA and the non-display area NDA. The first insulating layer 113 may cover the lower light blocking pattern BML. In some embodiments, the first insulating layer 113 may include an inorganic material such as $SiO_2$, $SiN_x$, SiON, $Al_2O_3$, $TiO_2$, $Ta_2O$, $HfO_2$, $ZrO_2$, or the like.

The semiconductor layer ACT may be positioned on the first insulating layer 113. In some embodiments, the semiconductor layer ACT may be disposed to correspond to the first light emitting area LA1, the second light emitting area LA2, and the third light emitting area LA3 in the display area DA, respectively.

In some embodiments, the semiconductor layer ACT may include an oxide semiconductor. For example, the semiconductor layer ACT is a Zn oxide-based material, and may be formed of Zn oxide, In—Zn oxide, Ga—In—Zn oxide, or the like, and may be an In—Ga—Zn—O (IGZO) semiconductor in which ZnO contains metals such as indium (In) and gallium (Ga). However, the semiconductor layer ACT is not limited thereto, and may also include amorphous silicon or polysilicon.

In some embodiments, the semiconductor layer ACT may be disposed to overlap each lower light blocking pattern BML, thereby suppressing generation of a photocurrent in the semiconductor layer ACT.

A first conductive layer may be positioned on the semiconductor layer ACT, and the first conductive layer may include a gate electrode GE. The gate electrode GE may be disposed to be positioned in the display area DA and overlap the semiconductor layer ACT.

The gate electrode GE may include one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed of a single layer or multiple layers, in consideration of adhesiveness with adjacent layers, surface flatness of stacked layers, processability, and the like.

A gate insulating layer 115 may be positioned between the semiconductor layer ACT and the first conductive layer or between the semiconductor layer ACT and the gate electrode GE in the display area DA. In some embodiments, the gate electrode GE and the gate insulating layer 115 may function as a mask for masking a channel region of the semiconductor layer ACT, and the width of the gate electrode GE and the gate insulating layer 115 may be narrower than the width of the semiconductor layer ACT.

In some embodiments, the gate insulating layer 115 may not be formed as a single layer disposed on a front surface of the base portion 110, but may have a partially patterned shape. In some embodiments, a width of the patterned gate insulating layer 115 may be wider than a width of the gate electrode GE or the first conductive layer.

In some embodiments, the gate insulating layer 115 may include an inorganic material. For example, the gate insulating layer 115 may include the inorganic material that may be used to form the first insulating layer 113, e.g., as discussed herein.

A second insulating layer 117 covering the semiconductor layer ACT and the gate electrode GE may be positioned on the gate insulating layer 115. The second insulating layer 117 may be positioned in the display area DA and the non-display area NDA. The second insulating layer 117 may include an organic material or an inorganic material. Although FIG. 7 illustrates a case in which the second insulating layer 117 is illustrated as a planarization film including an organic material, the second insulating layer 117 is not limited thereto, and may include an inorganic material and may also be conformally formed by reflecting a lower step.

The second conductive layer may be positioned on the second insulating layer 117, and the second conductive layer may include a source electrode SE and a drain electrode DE.

The source electrode SE and the drain electrode DE may be positioned in the display area DA, and may be disposed to be spaced apart from each other.

The drain electrode DE and the source electrode SE may each penetrate through the second insulating layer 117 and may be connected to the semiconductor layer ACT.

In some embodiments, the source electrode SE may penetrate through the first insulating layer 113 and the second insulating layer 117 and may also be connected to the lower light blocking pattern BML. In case that the lower light blocking pattern BML, is a portion of a line that transmits signals or voltages, the source electrode SE may be connected to the lower light blocking pattern BML to receive a voltage and the like provided to the line. As another example, in case that the lower light blocking pattern BML, is a floating pattern instead of a separate line, a voltage and the like provided to the source electrode SE may be transmitted to the lower light blocking pattern BML.

As another example, unlike that illustrated in FIG. 7, the drain electrode DE may penetrate through the first insulating layer 113 and the second insulating layer 117 and may also be connected to the lower light blocking pattern BML. In case that the lower light blocking pattern BML is not a line to which a separate signal is provided, a voltage and the like applied to the drain electrode DE may also be transmitted to the lower light blocking pattern BML.

The semiconductor layer ACT, the gate electrode GE, the source electrode SE, and the drain electrode DE described above may form the thin-film transistor TL as a switching element. In some embodiments, the thin-film transistor TL may be positioned in the first light emitting area LA1, the second light emitting area LA2, and the third light emitting area LA3, respectively. In some embodiments, a portion of the thin-film transistor TL may also be positioned in the non-light emitting area NLA.

The source electrode SE and the drain electrode DE may include aluminum (Al), copper (Cu), titanium (Ti), or the like, and may be formed as multiple layers or a single layer. In an embodiment, the source electrode SE and the drain electrode DE may have a multilayer structure of Ti/Al/Ti.

A third insulating layer 130 may be positioned on the second insulating layer 117. The third insulating layer 130 may cover the thin-film transistor TL in the display area DA, and may expose a portion of a voltage supply line in the non-display area NDA.

In some embodiments, the third insulating layer 130 may be a planarization layer. In some embodiments, the third insulating layer 130 may be made of an organic material. For example, the third insulating layer 130 may include an acrylic-based resin, an epoxy-based resin, an imide-based resin, an ester-based resin, or the like. In some embodiments, the third insulating layer 130 may include a photosensitive organic material.

A first anode electrode AE1, a second anode electrode AE2, and a third anode electrode AE3 may be positioned on the third insulating layer 130 in the display area DA.

The first anode electrode AE1 may overlap the first light emitting area LA1 and at least a portion thereof may extend to the non-light emitting area NLA. The second anode electrode AE2 may overlap the second light emitting area LA2 and at least a portion thereof may extend to the non-light emitting area NLA, and the third anode electrode AE3 may overlap the third light emitting area LA3 and at least a portion thereof may extend to the non-light emitting area NLA. The first anode electrode AE1 may penetrate through the third insulating layer 130 and may be connected to the drain electrode DE of the thin-film transistor TL corresponding to the first anode electrode AE1, the second anode electrode AE2 may penetrate through the third insulating layer 130 and may be connected to the drain electrode DE of the thin-film transistor TL corresponding to the second anode electrode AE2, and the third anode electrode AE3 may penetrate through the third insulating layer 130 and may be connected to the drain electrode DE of the thin-film transistor TL corresponding to the third anode electrode AE3.

In some embodiments, the first anode electrode AE1, the second anode electrode AE2, and the third anode electrode AE3 may be reflective electrodes, and in this case, the first anode electrode AE1, the second anode electrode AE2, and the third anode electrode AE3 may be metal layers including metals such as Ag, Mg, Al, Pt, Pd, Au, Ni, Nd, Ir, and Cr. In an embodiment, the first anode electrode AE1, the second anode electrode AE2, and the third anode electrode AE3 may further include metal oxide layers stacked on the metal layers. In an embodiment, the first anode electrode AE1, the second anode electrode AE2, and the third anode electrode AE3 may have a multilayer structure, for example, a two-layer structure of ITO/Ag, Ag/ITO, ITO/Mg, or ITO/MgF, or a three-layer structure such as ITO/Ag/ITO.

A pixel defining layer 150 may be positioned on the first anode electrode AE1, the second anode electrode AE2, and the third anode electrode AE3. The pixel defining layer 150 may include an opening exposing the first anode electrode AE1, an opening exposing the second anode electrode AE2, and an opening exposing the third anode electrode AE3, and may define the first light emitting area LA1, the second light emitting area LA2, the third light emitting area LA3, and the non-light emitting area NLA. For example, an area of the first anode electrode AE1 that is not covered and is exposed by the pixel defining layer 150 may be the first light emitting area LA1. Similarly, an area of the second anode electrode AE2 that is not covered and is exposed by the pixel defining layer 150 may be the second light emitting area LA2, and an area of the third anode electrode AE3 that is not covered and is exposed by the pixel defining layer 150 may be the third light emitting area LA3. The area in which the pixel defining layer 150 is positioned may be the non-light emitting area NLA.

In some embodiments, the pixel defining layer 150 may include an organic insulating material such as a polyacrylates resin, an epoxy resin, a phenolic resin, a polyamides resin, a polyimides resin, an unsaturated polyesters resin, a polyphenylenethers resin, a polyphenylenesulfides resin, or benzocyclobutene (BCB).

In some embodiments, the pixel defining layer 150 may overlap a bank pattern 190 and a light blocking pattern 260 to be described below.

As illustrated in FIG. 7, a light emitting layer OL may be positioned on the first anode electrode AE1, the second anode electrode AE2, and the third anode electrode AE3.

In some embodiments, the light emitting layer OL may have a continuous film shape formed over the light emitting areas LA1, LA2, and LA3 and the non-light emitting area NLA. Although FIGS. 7 and 8 illustrate that the light emitting layer OL is positioned only in the display area DA, the disclosure is not limited thereto. In some embodiments, a portion of the light emitting layer OL may be further positioned in the non-display area NDA. A more detailed description of the light emitting layer OL will be described below.

A cathode electrode CE may be positioned on the light emitting layer OL. A portion of the cathode electrode CE may be further positioned in the non-display area NDA. The cathode electrode CE may be electrically connected to a connection electrode and may contact the connection electrode in the non-display area NDA. The driving voltage (e.g., an ELVSS voltage) provided to the voltage supply line may be transmitted to the cathode electrode CE via the connection electrode.

In some embodiments, the cathode electrode CE may have semi-permeability or permeability. In case that the cathode electrode CE has the semi-permeability, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, for example, a mixture of Ag and Mg. In case that the cathode electrode CE has a thickness of several tens to several hundreds of angstroms, the cathode electrode CE may have semi-permeability.

In case that the cathode electrode CE has permeability, the cathode electrode CE may include a transparent conductive oxide (TCO). For example, the cathode electrode CE may include tungsten oxide ($W_xO_x$), titanium oxide ($TiO_2$), indium tin oxide (ITO), indium zinc oxide (IZO), zinc oxide (ZnO), indium tin zinc oxide (ITZO), magnesium oxide (MgO), or the like.

The first anode electrode AE1, the light emitting layer OL, and the cathode electrode CE may constitute a first light emitting device ED1, the second anode electrode AE2, the light emitting layer OL, and the cathode electrode CE may constitute a second light emitting device ED2, and the third anode electrode AE3, the light emitting layer OL, and the cathode electrode CE may constitute a third light emitting device ED3. Each of the first light emitting device ED1, the second light emitting device ED2, and the third light emitting device ED3 may emit emitted light LE.

As illustrated in FIG. 9, the emitted light LE finally emitted from the light emitting layer OL may be mixed light in which a first component LE1 and a second component LE2 are mixed. A peak wavelength of each of the first component LE1 and the second component LE2 of the emitted light LE may be about 440 nm or more and less than about 480 nm. For example, the emitted light LE may be blue light.

As illustrated in FIG. 9, in some embodiments, the light emitting layer OL may have a structure in which light emitting layers are disposed to overlap each other, for example, a tandem structure. For example, the light emitting layer OL may include a first stack ST1 including a first light emitting layer EML1, a second stack ST2 positioned on the first stack ST1 and including a second light emitting layer EML2, a third stack ST3 positioned on the second stack ST2 and including a third light emitting layer EML3, a first charge generation layer CGL1 positioned between the first stack ST1 and the second stack ST2, and a second charge generation layer CGL2 positioned between the second stack ST2 and the third stack ST3. The first stack ST1, the second stack ST2, and the third stack ST3 may be disposed to overlap each other. Although FIG. 9 illustrates the light emitting layer OL as a structure in which three light emitting layers EML1, EML2, and EML3 are stacked each other by including the first stack ST1 including the first light emitting layer EML1, the second stack ST2 positioned on the first stack ST1 and including the second light emitting layer EML2, and the third stack ST3 positioned on the second stack ST2 and including the third light emitting layer EML3, the light emitting layer OL is not limited thereto and may also have a structure in which four or more light emitting layers are stacked each other.

The first light emitting layer EML1, the second light emitting layer EML2, and the third light emitting layer EML3 may be disposed to overlap each other.

In some embodiments, all of the first light emitting layer EML1, the second light emitting layer EML2, and the third light emitting layer EML3 may emit the light of the first color, for example, the blue light. For example, each of the first light emitting layer EML1, the second light emitting layer EML2, and the third light emitting layer EML3 may be a blue light emitting layer and may include an organic material.

In some embodiments, at least one of the first light emitting layer EML1, the second light emitting layer EML2, and the third light emitting layer EML3 may emit first blue light having a first peak wavelength, and at least another one of the first light emitting layer EML1, the second light emitting layer EML2, and the third light emitting layer EML3 may emit second blue light having a second peak wavelength different from the first peak wavelength. For example, any one of the first light emitting layer EML1, the second light emitting layer EML2, and the third light emitting layer EML3 may emit the first blue light having the first peak wavelength, and the other two of the first light emitting layer EML1, the second light emitting layer EML2, and the third light emitting layer EML3 may emit the second blue light having the second peak wavelength. For example, the emitted light LE finally emitted from the light emitting layer OL may be a mixed light in which the first component LE1 and the second component LE2 are mixed, and the first component LE1 may be the first blue light having the first peak wavelength, and the second component LE2 may be the second blue light having the second peak wavelength.

In some embodiments, one of the first peak wavelength and the second peak wavelength may have a range of about 440 nm or more and less than about 460 nm, and the other one of the first peak wavelength and the second peak wavelength may have a range of about 460 nm or more and about 480 nm or less. However, the range of the first peak wavelength and the range of the second peak wavelength are not limited thereto. For example, both the range of the first peak wavelength and the range of the second peak wavelength may also include about 460 nm. In some embodiments, any one of the first blue light and the second blue light may be light of a deep blue color, and the other one of the first blue light and the second blue light may be light of a sky blue color.

According to some embodiments, the emitted light LE emitted from the light emitting layer OL may be blue light and may include a long-wavelength component and a short-wavelength component. Therefore, finally, the light emitting layer OL may emit blue light having an emission peak that is more widely distributed as the emitted light LE. As a result, there is an advantage at least in that color visibility may be improved at a side viewing angle compared to a conventional light emitting device emitting blue light having a sharp emission peak.

In some embodiments, each of the first light emitting layer EML1, the second light emitting layer EML2, and the third light emitting layer EML3 may include a host and a dopant. The host is not particularly limited as long as it is a commonly used material, but, for example, Alq3 (tris(8-hydroxyquinolino)aluminum), CBP (4,4'-bis(N-carbazolyl)-1,1'-biphenyl), PVK (poly(n-vinylcabazole)), ADN (9,10-di (naphthalene-2-yl)anthracene), TCTA (4,4',4"-Tris (carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2"-dimethyl-biphenyl), MADN (2-Methyl-9,10-bis(naphthalen-2-yl)anthracene), or the like may be used.

Each of the first light emitting layer EML1, the second light emitting layer EML2, and the third light emitting layer EML3 emitting blue light may include a fluorescent material including any one selected from the group consisting of, for example, spiro-DPVBi, spiro-6P, distyryl-benzene (DSB), distyryl-arylene (DSA), polyfluorene (PFO)-based polymers, and poly(p-phenylene vinylene) (PPV)-based polymers. As another example, each of the first light emitting layer EML1, the second light emitting layer EML2, and the third light emitting layer EML3 may also include a phosphorescent material containing an organometallic complex such as (4,6-F2ppy)2Irpic.

As described above, at least one of the first light emitting layer EML1, the second light emitting layer EML2, and the third light emitting layer EML3 emits blue light in a wavelength band different from that of the other one of the first light emitting layer EML1, the second light emitting layer EML2, and the third light emitting layer EML3. In order to emit blue light in different wavelength bands, the first light emitting layer EML1, the second light emitting layer EML2, and the third light emitting layer EML3 may include a same material, and a method of adjusting a resonance distance may be used. As another example, in order to emit blue light in different wavelength bands, at least one of the first light emitting layer EML1, the second light emitting layer EML2, and the third light emitting layer EML3 and the other one of the first light emitting layer EML1, the second light emitting layer EML2, and the third light emitting layer EML3 may also include different materials.

However, the first light emitting layer EML1, the second light emitting layer EML2, and the third light emitting layer EML3 are not limited thereto, and the blue light emitted from each of the first light emitting layer EML1, the second light emitting layer EML2, and the third light emitting layer EML3 may also have a peak wavelength of about 440 nm to about 480 nm, and the first light emitting layer EML1, the second light emitting layer EML2, and the third light emitting layer EML3 may also be made of a same material.

As another example, in an embodiment, at least one of the first light emitting layer EML1, the second light emitting layer EML2, and the third light emitting layer EML3 may emit the first blue light having the first peak wavelength, another one of the first light emitting layer EML1, the second light emitting layer EML2, and the third light emitting layer EML3 may emit second blue light having a second peak wavelength different from the first peak wavelength, and the other one of the first light emitting layer EML1, the second light emitting layer EML2, and the third light emitting layer EML3 may emit third blue light having a third peak wavelength different from the first peak wavelength and the second peak wavelength. In some embodiments, any one of the first peak wavelength, the second peak wavelength, and the third peak wavelength may have a range of about 440 nm or more and less than about 460 nm. Another one of the first peak wavelength, the second peak wavelength, and the third peak wavelength may have a range of about 460 nm or more and less than about 470 nm, and the other one of the first peak wavelength, the second peak wavelength, and the third peak wavelength may also have a range of about 470 nm or more and about 480 nm or less.

According to some embodiments, the emitted light LE emitted from the light emitting layer OL is blue light and includes a long-wavelength component, an intermediate-wavelength component, and a short-wavelength component. Therefore, finally, the light emitting layer OL may emit blue light having an emission peak that is more widely distributed as the emitted light LE, and may improve color visibility at a side viewing angle.

According to the embodiments described above, compared to a conventional light emitting device that does not employ the tandem structure, for example, the structure in which the light emitting layers are stacked each other, there are advantages of increasing light efficiency and improving the lifespan of the display device.

As another example, in some embodiments, at least one of the first light emitting layer EML1, the second light emitting layer EML2, and the third light emitting layer EML3 may emit light of the first color, for example, blue light, and at least the other one of the first light emitting layer EML1, the second light emitting layer EML2, and the third light emitting layer EML3 may emit light of the second color, for example, green light. In some embodiments, the peak wavelength of the blue light emitted from at least one of the first light emitting layer EML1, the second light emitting layer EML2, and the third light emitting layer EML3 may have a range of about 440 nm or more to about 480 nm or less, or about 460 nm or more to about 480 nm or less. The green light emitted from at least the other one of the first light emitting layer EML1, the second light emitting layer EML2, and the third light emitting layer EML3 may have a peak wavelength in a range of about 510 nm to about 550 nm.

For example, any one of the first light emitting layer EML1, the second light emitting layer EML2, and the third light emitting layer EML3 may be a green light emitting layer emitting green light, and the other two of the first light emitting layer EML1, the second light emitting layer EML2, and the third light emitting layer EML3 may be a blue light emitting layer emitting blue light. In case that the other two of the first light emitting layer EML1, the second light emitting layer EML2, and the third light emitting layer EML3 are the blue light emitting layer, the ranges of the peak wavelengths of the blue light emitted from the two blue light emitting layers may be the same as each other, and the ranges of the peak wavelengths of the blue light emitted from the two blue light emitting layers may be different from each other.

According to some embodiments, the emitted light LE emitted from the light emitting layer OL may be mixed light in which a first component LE1 that is blue light and a second component LE2 that is green light are mixed. For example, in case that the first component LE1 is dark blue light and the second component LE2 is green light, the emitted light LE may be light having a sky blue color. Similar to the embodiments described above, the emitted light LE emitted from the light emitting layer OL is mixed light of blue light and green light, and includes a long-wavelength component and a short-wavelength component. Therefore, finally, the light emitting layer OL may emit blue light having an emission peak that is more widely distributed as the emitted light LE, and may improve color visibility at a side viewing angle. Since the second component LE2 of the emitted light LE is the green light, it is possible to supplement the green light component of the light externally provided from the display device 1, and thus color reproducibility of the display device 1 may be improved.

In some embodiments, a green light emitting layer among the first light emitting layer EML1, the second light emitting layer EML2, and the third light emitting layer EML3 may include a host and a dopant. The host included in the green light emitting layer is not particularly limited as long as it is a commonly used material, but, for example, Alq3 (tris(8-hydroxyquinolino)aluminum), CBP (4,4'-bis(N-carbazolyl)-1,1'-biphenyl), PVK (poly(n-vinylcabazole)), ADN (9,10-di (naphthalene-2-yl)anthracene), TCTA (4,4',4"-Tris (carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2"-dimethyl-biphenyl), MADN (2-Methyl-9,10-bis(naphthalen-2-yl)anthracene), or the like may be used.

The dopant included in the green light emitting layer may be, for example, a fluorescent material including Alq3 (tris-(8-hydroyquinolato)aluminum(III)), or Ir(ppy)3(fac tris (2-phenylpyridine)iridium), Ir(ppy)2(acac)(Bis(2-phenylpyridine)(acetylacetonate)iridium(III)), Ir(mpyp)3(2-phenyl-4-methyl-pyridine iridium), or the like as a phosphorescent material.

The first charge generation layer CGL1 may be positioned between the first stack ST1 and the second stack ST2. The first charge generation layer CGL1 may serve to inject charges into each light emitting layer. The first charge generation layer CGL1 may serve to adjust a charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11, and may be positioned between the n-type charge generation layer CGL11 and the second stack ST2.

The first charge generation layer CGL1 may have a structure in which the n-type charge generation layer CGL11 and the p-type charge generation layer CGL12 are bonded to each other. The n-type charge generation layer CGL11 is disposed closer to the anode electrodes AE1, AE2, and AE3 among the anode electrodes AE1, AE2, and AE3 and the cathode electrode CE. The p-type charge generation layer CGL12 is disposed closer to the cathode electrode CE among the anode electrodes AE1, AE2, and AE3 and the cathode electrode CE. The n-type charge generation layer CGL11 supplies electrons to the first light emitting layer EML1 adjacent to the anode electrodes AE1, AE2, and AE3, and the p-type charge generation layer CGL12 supplies holes to the second light emitting layer EML2 included in the second stack ST2. The first charge generation layer CGL1 may be disposed between the first stack ST1 and the second stack ST2 to provide the charges to each of the light emitting layers, thereby increasing emission efficiency and lowering a driving voltage.

The first stack ST1 may be positioned on the first anode electrode AE1, the second anode electrode AE2, and the third anode electrode AE3, and may further include a first hole transport layer HTL1, a first electron block layer BIL1 and a first electron transport layer ETL1.

The first hole transport layer HTL1 may be disposed on the first anode electrode AE1, the second anode electrode AE2, and the third anode electrode AE3. The first hole transport layer HTL1 may serve to smoothly transport holes and may include a hole transport material. The hole transport material may include carbazole-based derivatives such as N-phenylcarbazole and polyvinylcarbazole, fluorene-based derivatives, triphenylamine-based derivatives such as TPD (N,N'-bis(3-methylphenyl)-N,N'-diphenyl-[1,1-biphenyl]-4,4'-diamine), TCTA (4,4',4''-tris(N-carbazolyl)triphenylamine), or the like, NPB (N,N'-di(1-naphthyl)-N,N'-diphenyl-benzidine), TAPC (4,4''-Cyclohexylidene bis[N,N-bis(4-methylphenyl)benzenamine]), or the like, but is not limited thereto.

The first electron block layer BIL1 may be positioned on the first hole transport layer HTL1, and may be positioned between the first hole transport layer HTL1 and the first light emitting layer EML1. The first electron block layer BIL1 may include a hole transport material and a metal or a metal compound to prevent electrons, generated in the first light emitting layer EML1, from flowing into the first hole transport layer HTL1. In some embodiments, the first hole transport layer HTL1 and first electron block layer BIL1 that are described above may also be formed as a single layer in which the respective materials are mixed.

The first electron transport layer ETL1 may be disposed on the first light emitting layer EML1, and may be positioned between the first charge generation layer CGL1 and the first light emitting layer EML1. In some embodiments, the first electron transport layer ETL1 may include an electron transport material such as Alq3 (Tris(8-hydroxyquinolinato)aluminum), TPBi (1,3,5-Tri(1-phenyl-1H-benzo[d]imidazol-2-yl)phenyl), BCP (2,9-Dimethyl-4,7-diphenyl-1,10-phenanthroline), Bphen (4,7-Diphenyl-1,10-phenanthroline), TAZ (3-(4-Biphenylyl)-4-phenyl-5-tert-butylphenyl-1,2,4-triazole), NTAZ (4-(Naphthalen-1-yl)-3,5-diphenyl-4H-1,2,4-triazole), tBu-PBD (2-(4-Biphenylyl)-5-(4-tert-butylphenyl)-1,3,4-oxadiazole), BAlq (Bis(2-methyl-8-quinolinolato-N1,O8)-(1,1'-Biphenyl-4-olato) aluminum), Bebq2 (berylliumbis(benzoquinolin-10-olate), ADN (9,10-di(naphthalene-2-yl)anthracene), and mixtures thereof. However, the disclosure is not limited to the type of the electron transport material. The second stack ST2 may be positioned on the first charge generation layer CGL1 and may further include a second hole transport layer HTL2, a second electron block layer BIL2, and a second electron transport layer ETL2.

The second hole transport layer HTL2 may be disposed on the first charge generation layer CGL1. The second hole transport layer HTL2 and the first hole transport layer HTL1 may be made of a same material, or the second hole transport layer HTL2 may also include one or more materials selected from the materials that may be used to form the first hole transport layer HTL1, e.g., as discussed herein. The second hole transport layer HTL2 may be formed as a single layer or layers.

The second electron block layer BIL2 may be positioned on the second hole transport layer HTL2, and may be positioned between the second hole transport layer HTL2 and the second light emitting layer EML2. The second electron block layer BIL2 and the first electron block layer BIL1 may be made of a same material and have a same structure, or the second electron block layer BIL2 may also include one or more materials selected from the materials that may be used to form the first electron block layer BIL1 e.g., as discussed herein.

The second electron transport layer ETL2 may be positioned on the second light emitting layer EML2, and may be positioned between the second charge generation layer CGL2 and the second light emitting layer EML2. The second electron transport layer ETL2 and as the first electron transport layer ETL1 may be made of a same material and have a same structure, or the second electron transport layer ETL2 may also include one or more materials selected from the materials that may be used to form the first electron transport layer ETL1, e.g., as discussed herein. The second electron transport layer ETL2 may be formed as a single layer or layers.

The second charge generation layer CGL2 may be positioned on the second stack ST2 and positioned between the second stack ST2 and the third stack ST3.

The second charge generation layer CGL2 and the first charge generation layer CGL1 described above may have a same structure. For example, the second charge generation layer CGL2 may include an n-type charge generation layer CGL21 disposed closer to the second stack ST2 and a p-type charge generation layer CGL22 disposed closer to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are bonded to each other. The first charge generation layer CGL1 and the second charge generation layer CGL2 may also be made of different materials, and may also be made of a same material.

The second stack ST2 may be positioned on the second charge generation layer CGL2 and may further include a third hole transport layer HTL3 and a third electron transport layer ETL3.

The third hole transport layer HTL3 may be disposed on the second charge generation layer CGL2. The third hole transport layer HTL3 and the first hole transport layer HTL1 may be made of a same material, or the third hole transport layer HTL3 may also include one or more materials selected from the materials that may be used to form the first hole transport layer HTL1, e.g., as discussed herein. The third hole transport layer HTL3 may be formed as a single layer or layers. In case that the third hole transport layer HTL3 is formed as multiple layers, each layer may also include different materials.

The third electron transport layer ETL3 may be disposed on the third light emitting layer EML3, and may be positioned between the cathode electrode CE and the third light emitting layer EML3. The third electron transport layer ETL3 and the first electron transport layer ETL1 may be made of a same material and have a same structure, or the third electron transport layer ETL3 may also include one or more materials selected from the materials that may be used to form the first electron transport layer ETL1, e.g., as discussed herein. The third electron transport layer ETL3 may be formed as a single layer or layers. In case that the third electron transport layer ETL3 is formed as multiple layers, each layer may also include different materials.

Although not illustrated in the drawings, a hole injection layer may be further positioned in at least one of between the first stack ST1 and the first anode electrode AE1, the second anode electrode AE2, and the third anode electrode AE3, between the second stack ST2 and the first charge generation layer CGL1, and between the third stack ST3 and the second charge generation layer CGL2, respectively. The hole injection layer may serve to more smoothly inject holes into the first light emitting layer EML1, the second light emitting layer EML2, and the third light emitting layer EML3. In some embodiments, the hole injection layer may be made of one or more selected from the group consisting of copper phthalocyanine (CuPc), poly(3,4)-ethylenedioxythiophene (PEDOT), polyaniline (PANT), and N,N-dinaphthyl-N,N'-diphenyl benzidine (NPD), but is not limited thereto. In some embodiments, the hole injection layer may be positioned between the first stack ST1 and the first anode electrode AE1, the second anode electrode AE2, and the third anode electrode AE3, between the second stack ST2 and the first charge generation layer CGL1, and between the third stack ST3 and the second charge generation layer CGL2, respectively.

Although not illustrated in the drawings, an electron injection layer may be further positioned in at least one of between the third electron transport layer ETL3 and the cathode electrode CE, between the second charge generation layer CGL2 and the second stack ST2, and between the first charge generation layer CGL1 and the first stack ST1. The electron injection layer serves to smoothly inject electrons, and may include, but is not limited to, Alq3 (tris(8-hydroxyquinolino)aluminum), PBD, TAZ, Spiro-PBD, BAlq, or SAlq. The electron injection layer may be a metal halide compound, and may be, for example, one or more selected from the group consisting of $MgF_2$, LiF, NaF, KF, RbF, CsF, FrF, LiI, NaI, KI, RbI, CsI, FrI, and $CaF_2$, but is not limited thereto. The electron injection layer may also include a lanthanide-based material such as Yb, Sm, or Eu. As another example, the electron injection layer may include both a metal halide material and a lanthanide-based material such as RbI:Yb, KI:Yb, and the like. In case that the electron injection layer includes both the metal halide material and the lanthanide-based material, the electron injection layer may be formed by co-deposition of the metal halide material and the lanthanide-based material. In some embodiments, the electron injection layer may also be positioned between the third electron transport layer ETL3 and the cathode electrode CE, between the second charge generation layer CGL2 and the second stack ST2, and between the first charge generation layer CGL1 and the first stack ST1, respectively.

In addition to the above-described structure, the structure of the light emitting layer OL may be modified. For example, the light emitting layer OL may also be modified similar to a light emitting layer OLa illustrated in FIG. 10. The light emitting layer OLa illustrated in FIG. 10 may further include a fourth stack ST4 positioned between the third stack ST3 and the second stack ST2, unlike the structure illustrated in FIG. 9, and may further include a third charge generation layer CGL3 positioned between the third stack ST3 and the second stack ST2.

The fourth stack ST4 may include a fourth light emitting layer EML4, and may further include a fourth hole transport layer HTL4, a fourth electron block layer BIL4, and a fourth electron transport layer ETL4.

Each of the first light emitting layer EML1, the second light emitting layer EML2, the third light emitting layer EML3, and the fourth light emitting layer EML4 included in the light emitting layer OLa may emit the light of the first color, for example, the blue light. At least one of the first light emitting layer EML1, the second light emitting layer EML2, the third light emitting layer EML3, and the fourth light emitting layer EML4, and at least another one of the first light emitting layer EML1, the second light emitting layer EML2, the third light emitting layer EML3, and the fourth light emitting layer EML4 may emit blue light having ranges of different peak wavelengths.

As another example, at least one of the first light emitting layer EML1, the second light emitting layer EML2, the third light emitting layer EML3, and the fourth light emitting layer EML4 may emit green light, and at least another one of the first light emitting layer EML1, the second light emitting layer EML2, the third light emitting layer EML3, and the fourth light emitting layer EML4 may also emit blue light. For example, any one of the first light emitting layer EML1, the second light emitting layer EML2, the third light emitting layer EML3, and the fourth light emitting layer EML4 may be a green light emitting layer, and all of the other three light emitting layers may be blue light emitting layers.

The fourth hole transport layer HTL4 may be positioned on the second charge generation layer CGL2. The fourth hole transport layer HTL4 and the first hole transport layer HTL1 may be made of a same material, or the fourth hole transport layer HTL4 may also include one or more materials selected from the materials that may be used to form the first hole transport layer HTL1, e.g., as discussed herein. The fourth hole transport layer HTL4 may be formed as a single layer or layers. In case that the fourth hole transport layer HTL4 is formed as multiple layers, each layer may also include different materials.

The fourth electron block layer BIL4 may be positioned on the fourth hole transport layer HTL4, and may be positioned between the fourth hole transport layer HTL4 and the fourth light emitting layer EML4. The fourth electron block layer BIL4 and the first electron block layer BIL1 may be made of a same material and have a same structure, or the fourth electron block layer BIL4 may also include one or more materials selected from the materials that may be used to form the first electron block layer BIL1 as discussed herein. In some embodiments, the fourth electron block layer BIL4 may also be omitted.

The fourth electron transport layer ETL4 may be positioned on the fourth light emitting layer EML4, and may be positioned between the third charge generation layer CGL3 and the fourth light emitting layer EML4. The fourth electron transport layer ETL4 and the first electron transport layer ETL1 may be made of a same material and have a same structure, or the fourth electron transport layer ETL4 may also include one or more materials selected from the materials that may be used to form the first electron transport layer ETL1, e.g., as discussed herein. The fourth electron transport layer ETL4 may be formed as a single layer or layers. In case that the fourth electron transport layer ETL4 is formed as multiple layers, each layer may also include different materials.

The third charge generation layer CGL3 and the first charge generation layer CGL1 described above may have a same structure. For example, the third charge generation layer CGL3 may include an n-type charge generation layer CGL31 disposed closer to the second stack ST2 and a p-type charge generation layer CGL32 disposed closer to the cathode electrode CE. The p-type charge generation layer CGL32 may be disposed on the n-type charge generation layer CGL31.

Although not illustrated in the drawings, the electron injection layer may be further positioned between the fourth stack ST4 and the third charge generation layer CGL3. The hole injection layer may be further positioned between the fourth stack ST4 and the second charge generation layer CGL2.

In some embodiments, the light emitting layer OL illustrated in FIG. 9 and the light emitting layer OLa illustrated in FIG. 10 may not include a red light emitting layer in common, and thus may not emit the light of the first color, for example, the red light. For example, the emitted light LE may not include a light component having a peak wavelength in a range of about 610 nm to about 650 nm, and the emitted light LE may include only a light component having a peak wavelength of about 440 nm to about 550 nm.

As illustrated in FIG. 7, a first capping layer 160 may be positioned on the cathode electrode CE. The first capping layer 160 may be disposed in common in the first light emitting area LA1, the second light emitting area LA2, the third light emitting area LA3, and the non-light emitting area NLA, and may improve viewing angle characteristics and increase external emission efficiency.

The first capping layer 160 may include at least one of an inorganic material and an organic material having a light transmitting property. For example, the first capping layer 160 may be formed as an inorganic layer or may be formed as an organic layer, and may also be formed as an organic layer including inorganic particles. For example, the first capping layer 160 may include a triamine derivative, a carbazole biphenyl derivative, an arylenediamine derivative, or an aluminum quinorium composite (Alq3).

The first capping layer 160 may be formed of a mixture of a high-refractive material and a low-refractive material. As another example, the first capping layer 160 may include two layers having different refractive indices, for example, a high-refractive index layer and a low-refractive index layer.

An encapsulation layer 170 may be disposed on the first capping layer 160. The encapsulation layer 170 protects components, positioned below the encapsulation layer 170, for example, the light emitting devices ED1, ED2, and ED3, from external foreign substances such as moisture. The encapsulation layer 170 is disposed in the first light emitting area LA1, the second light emitting area LA2, the third light emitting area LA3, and the non-light emitting area NLA in common. The encapsulation layer 170 may be a thin-film encapsulation layer.

In some embodiments, the encapsulation layer 170 may include a lower inorganic layer 171, an organic layer 173, and an upper inorganic layer 175 sequentially stacked each other on the first capping layer 160.

In some embodiments, the lower inorganic layer 171 may cover the first light emitting device ED1, the second light emitting device ED2, and the third light emitting device ED3 in the display area DA.

In some embodiments, the lower inorganic layer 171 may completely cover the first capping layer 160.

The organic layer 173 may be positioned on the lower inorganic layer 171. The organic layer 173 may cover the first light emitting device ED1, the second light emitting device ED2, and the third light emitting device ED3 in the display area DA.

The upper inorganic layer 175 may be positioned on the organic layer 173. The upper inorganic layer 175 may cover the organic layer 173.

In some embodiments, each of the lower inorganic layer 171 and the upper inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

In some embodiments, the organic layer 173 may be made of an acrylic-based resin, a methacrylic-based resin, polyisoprene, a vinyl-based resin, an epoxy-based resin, a urethane-based resin, a cellulose-based resin, a perylene-based resin, a silicon-based resin, or the like.

Hereinafter, the color conversion portion 30 will be described with further reference to FIGS. 1 to 8 and 11 to 14.

Figure 11:
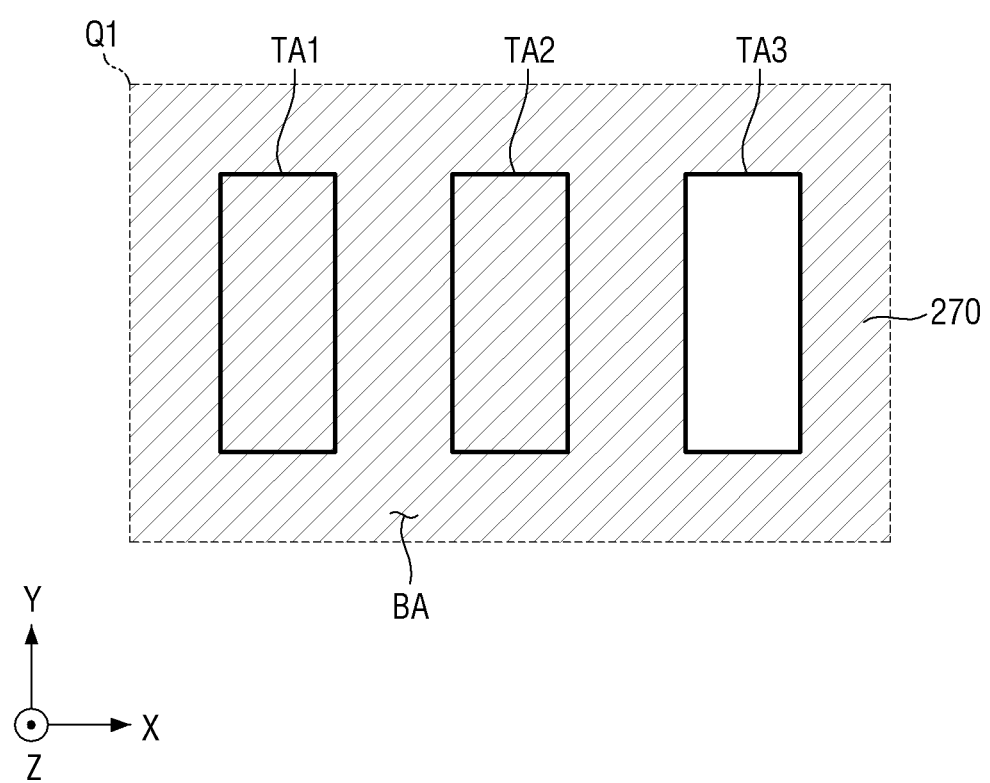
FIG. 11 is a schematic plan view illustrating a schematic arrangement of a color filter in the color conversion portion of the display device according to an example embodiment.
Figure 12:
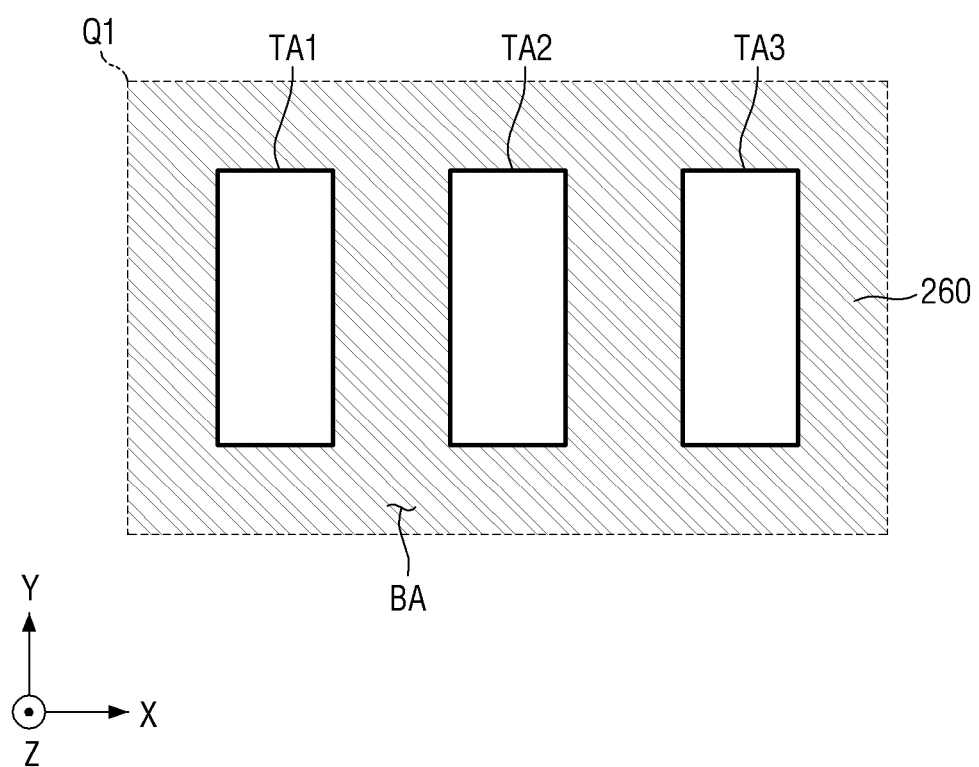
FIG. 12 is a schematic plan view illustrating a schematic arrangement of a light blocking member in the color conversion portion of the display device according to an example embodiment.
Figure 13:
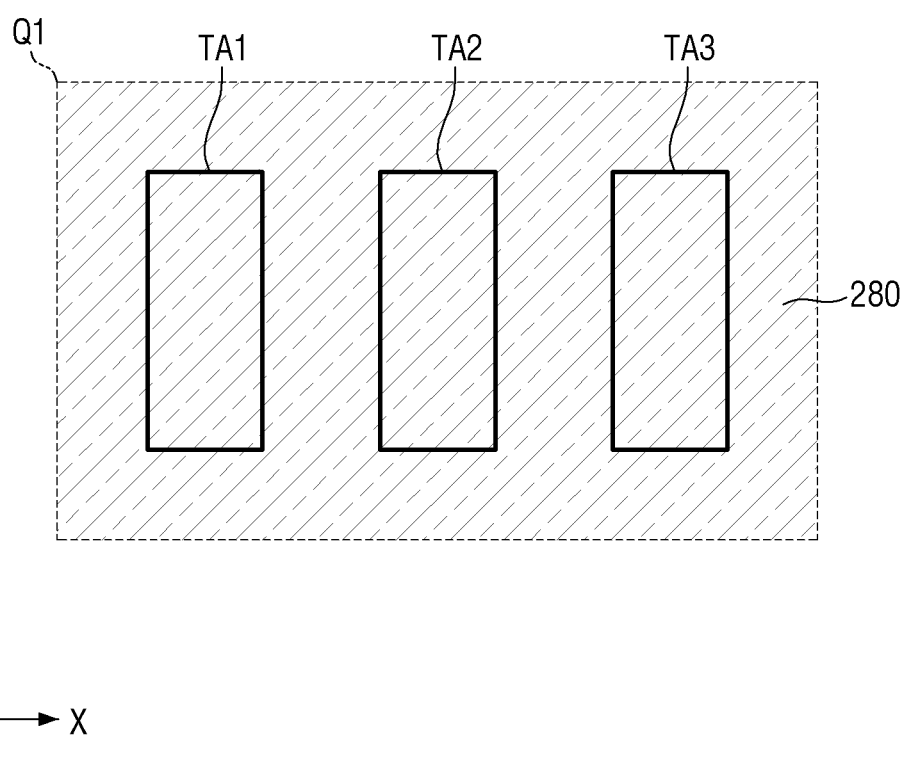
FIG. 13 is a schematic plan view illustrating a schematic arrangement of a second organic insulating layer in the color conversion portion of the display device according to an example embodiment.
Figure 14:
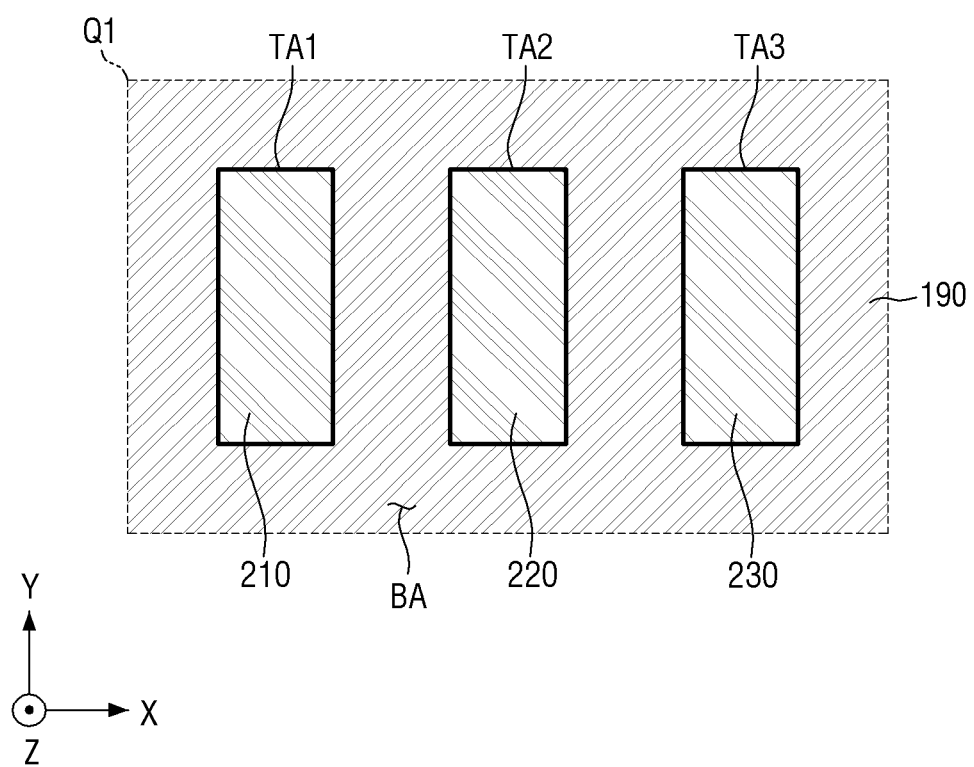
FIG. 14 is a schematic plan view illustrating a schematic arrangement of a bank pattern, a first wavelength conversion pattern, a second wavelength conversion pattern, and a light transmission pattern in the color conversion portion of the display device according to an example embodiment.

FIG. 11 is a schematic plan view illustrating a schematic arrangement of a color filter in the color conversion portion of the display device according to an embodiment. FIG. 12 is a schematic plan view illustrating a schematic arrangement of a light blocking member in the color conversion portion of the display device according to an embodiment. FIG. 13 is a schematic plan view illustrating a schematic arrangement of a second organic insulating layer in the color conversion portion of the display device according to an embodiment. FIG. 14 is a schematic plan view illustrating a schematic arrangement of a bank pattern, a first wavelength conversion pattern, a second wavelength conversion pattern, and a light transmission pattern in the color conversion portion of the display device according to an embodiment.

The color conversion portion 30 may include a second capping layer 180, a bank pattern 190, wavelength conversion patterns 210 and 220, a light transmission pattern 230, an inorganic insulating layer 240, a first organic insulating layer 250, a light blocking pattern 260, a color filter 270, and a second organic insulating layer 280.

The second capping layer 180 may be disposed on the encapsulation layer 170. The second capping layer 180 may be disposed on a lower side of the wavelength conversion patterns 210 and 220 and the light transmission pattern 230 to be described below to prevent moisture permeation from the lower side to the wavelength conversion patterns 210 and 220. The second capping layer 180 may include at least one of the materials that may be used to form the first capping layer 160, e.g., as discussed herein.

A bank pattern 190 may be positioned on the second capping layer 180. In some embodiments, the bank pattern 190 may be disposed to overlap the non-light emitting area NLA or the light blocking area BA. In some embodiments, the bank pattern 190 may surround the first light transmitting area TA1, the second light transmitting area TA2, and the third light transmitting area TA3 in a plan view as illustrated in FIG. 14. The bank pattern 190 may partition a space in which a first wavelength conversion pattern 210, a second wavelength conversion pattern 220, and the light transmission pattern 230 are disposed.

In some embodiments, the bank pattern 190 may be formed as an integral pattern as illustrated in FIG. 14, but is not limited thereto. In an embodiment, a portion of the bank pattern 190 surrounding the first light transmitting area TA1, a portion of the bank pattern 190 surrounding the second light transmitting area TA2, and a portion of the bank pattern 190 surrounding the third light transmitting area TA3 may also be configured as individual patterns separated from each other. For example, the bank pattern 190 may have a lattice shape in a plan view.

In case that the bank pattern 190 is configured as the individual patterns separated from each other, a groove may also be additionally disposed between the adjacent individual patterns. For example, a separation space may exist between the adjacent individual patterns.

However, even in case that the bank pattern 190 is formed as an integral pattern, the groove may also be additionally formed in the bank pattern 190.

In some embodiments, in case that the bank pattern 190 is formed as an integral pattern, an opening may also be formed on a surface of the bank pattern 190. For example, a thickness of the bank pattern 190 may be different for each area. In case that the first wavelength conversion pattern 210, the second wavelength conversion pattern 220, and the light transmission pattern 230 are formed by discharging an ink composition by using a nozzle, for example, by an inkjet printing method, the bank pattern 190 may serve as a guide for stably positioning the discharged ink composition at a desired position. For example, the bank pattern 190 may function as a partition.

In some embodiments, the bank pattern 190 may overlap the pixel defining layer 150.

In some embodiments, the bank pattern 190 may include an organic material having photocurability. In some embodiments, the bank pattern 190 may include an organic material having photocurability and including a light blocking material. In case that the bank pattern 190 has a light blocking property, it is possible to prevent light from penetrating between the light emitting areas adjacent to each other in the display area DA. For example, the bank pattern 190 may prevent the emitted light LE, emitted from the second light emitting device ED2, from being incident on the first wavelength conversion pattern 210 overlapping the first light emitting area LA1. The bank pattern 190 may block or prevent external light from penetrating into the components positioned below the bank pattern 190 in the non-light emitting area NLA and the non-display area NDA.

The first wavelength conversion pattern 210, the second wavelength conversion pattern 220, and the light transmission pattern 230 may be positioned on the second capping layer 180. In some embodiments, the first wavelength conversion pattern 210, the second wavelength conversion pattern 220, and the light transmission pattern 230 may be positioned in the display area DA. The light transmission pattern 230 may overlap the third light emitting area LA3 or the third light emitting device ED3. The light transmission pattern 230 may be positioned in a space partitioned by the bank pattern 190 in the third light transmitting area TA3.

In some embodiments, the light transmission pattern 230 may be formed as an island-like pattern. Although the drawing illustrates that the light transmission pattern 230 does not overlap the light blocking area BA, this is only an example. In some embodiments, a portion of the light transmission pattern 230 may overlap the light blocking area BA.

The light transmission pattern 230 may transmit incident light. As described above, the emitted light LE provided from the third light emitting device ED3 may be the blue light. The emitted light LE, which is the blue light, transmits through the light transmission pattern 230 and is emitted to the outside of the display device 1. For example, the third light L3 emitted to the outside of the display device 1 in the third light emitting area LA3 may be the blue light.

In some embodiments, the light transmission pattern 230 may include a third base resin 231, and may further include third scatterers 235 dispersed in the third base resin 231.

The third base resin 231 may be made of a material having high light transmittance. In some embodiment, the third base resin 231 may be made of an organic material. For example, the third base resin 231 may include an organic material such as an epoxy-based resin, an acrylic resin, a cardo-based resin, or an imide-based resin.

The third scatterer 235 and the third base resin 231 may have different refractive indices, and the third scatterer 235 may form an optical interface with the third base resin 231. For example, the third scatterers 235 may be light scattering particles. The third scatterer 235 is not particularly limited as long as it is a material capable of scattering at least a portion of transmitted light, but may be, for example, a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, and examples of a material of the organic particle may include an acrylic-based resin, a urethane-based resin, or the like. The third scatterer 235 may scatter light in a random direction irrespective of an incident direction of the incident light without substantially converting a wavelength of the light transmitted through the light transmission pattern 230.

The first wavelength conversion pattern 210 may be disposed on the second capping layer 180, and may overlap the first light emitting area LA1, the first light emitting device ED1, or the first light transmitting area TA1.

In some embodiments, the first wavelength conversion pattern 210 may be positioned in the space partitioned by the bank pattern 190 in the first light transmitting area TA1.

In some embodiments, the first wavelength conversion pattern 210 may be formed in the form of an island pattern as illustrated in FIG. 14. Although the drawing illustrates that the first wavelength conversion pattern 210 does not overlap the light blocking area BA, this is only an example. In some embodiments, a portion of the first wavelength conversion pattern 210 may also overlap the light blocking area BA.

In some embodiments, the first wavelength conversion pattern 210 may directly contact the second capping layer 180 and the bank pattern 190.

The first wavelength conversion pattern 210 may convert or shift a peak wavelength of the incident light to another specific peak wavelength and emit the light. In some embodiments, the first wavelength conversion pattern 210 may convert the emitted light LE, provided from the first light emitting device ED1, into red light having a peak wavelength in a range of about 610 nm to about 650 nm, and emit the red light.

In some embodiments, the first wavelength conversion pattern 210 may include a first base resin 211 and first wavelength shifters 213 dispersed in the first base resin 211, and may further include first scatterers 215 dispersed in the first base resin 211.

The first base resin 211 may be made of a material having high light transmittance. In some embodiment, the first base resin 211 may be made of an organic material. In some embodiments, the first base resin 211 and the third base resin 231 may be made of a same material, or may include at least one of the materials that may be used to form the third base resin 231, e.g., as discussed herein.

The first wavelength shifter 213 may convert or shift the peak wavelength of the incident light to another specific peak wavelength. In some embodiments, the first wavelength shifter 213 may convert the emitted light LE of the third color, which is the blue light provided from the first light emitting device ED1, into red light having a single peak wavelength in a range of about 610 nm to about 650 nm, and emit the red light.

The first wavelength shifter 213 may be, for example, a quantum dot, a quantum bar, or a phosphor. For example, the quantum dot may be particulate matter that emits a specific color as electrons transition from a conduction band to a valence band.

The quantum dot may be a semiconductor nanocrystal material. The quantum dot may have a specific bandgap according to its composition and size to absorb light and emit light having a unique wavelength. Examples of nanocrystals of the quantum dot may include group IV nanocrystals, group II-VI compound nanocrystals, group III-V compound nanocrystals, group IV-VI compound nanocrystals, or combinations thereof.

A group II-VI compound may be selected from the group consisting of a binary compound selected from the group consisting of CdSe, CdTe, ZnS, ZnSe, ZnTe, ZnO, HgS, HgSe, HgTe, MgSe, MgS, and mixtures thereof, a ternary compound selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

A group III-V compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

A group IV-VI compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. A group IV element may be selected from the group consisting of Si, Ge, and mixtures thereof. A group IV compound may be a binary compound selected from the group consisting of SiC, SiGe, and mixtures thereof.

The binary compound, the ternary compound, or the quaternary compound may be present in a particle at a uniform concentration or may be present in a same particle in a state of partially different concentration distributions. The quantum dot may have a core/shell structure in which a quantum dot surrounds another quantum dot. An interface between a core and a shell may have a concentration gradient in which a concentration of an element present in the shell decreases toward the center.

In some embodiments, the quantum dot may have a core-shell structure including a core including the above-described nanocrystals and a shell surrounding the core. The shell of the quantum dot may serve as a protective layer for maintaining semiconductor properties by preventing chemical modification of the core and/or a charging layer for imparting electrophoretic properties to the quantum dot. The shell may have a single layer or multiple layers. An interface between a core and a shell may have a concentration gradient in which a concentration of an element present in the shell decreases toward the center. Examples of the shell of the quantum dot may include a metal or non-metal oxide, a semiconductor compound, or a combination thereof.

For example, examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like or a ternary compound such as $MgAl_2O_4$, $CoFe_2O_4$, $NiFe_2O_4$, $CoMn_2O_4$, or the like, but the disclosure is not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the disclosure is not limited thereto.

The light emitted by the first wavelength shifter 213 may have an emission wavelength spectrum full width at half maximum (FWHM) of about 45 nm or less, or about 40 nm or less, or about 30 nm or less, and thus, color purity and color reproducibility of colors displayed by the display device 1 may be further improved. The light emitted by the first wavelength shifter 213 may be emitted in several directions regardless of the incident direction of the incident light. Thus, side visibility of the first color displayed in the first light transmitting area TA1 may be improved.

A portion of the emitted light LE provided from the first light emitting device ED1 may be emitted through the first wavelength conversion pattern 210 without being converted into red light by the first wavelength shifter 213. A component of the emitted light LE incident on the color filter 270 without being converted by the first wavelength conversion pattern 210 may be blocked by the color filter 270 to be described below. On the other hand, the red light of the emitted light LE converted by the first wavelength conversion pattern 210 is emitted to the outside through the color filter 270. For example, the first light L1 emitted to the outside of the display device 1 through the first light transmitting area TA1 may be the red light.

The first scatterer 215 and the first base resin 211 may have different refractive indices, and the first scatterer 215 may form an optical interface with the first base resin 211. For example, the first scatterers 215 may be light scattering particles. Other detailed descriptions of the first scatterers 215 are substantially the same as or similar to those of the third scatterers 235, and thus will be omitted.

The second wavelength conversion pattern 220 may be positioned in a space partitioned by the bank pattern 190 in the second light transmitting area TA2.

In some embodiments, the second wavelength conversion pattern 220 may be formed in the form of an island pattern as illustrated in FIG. 14. In some embodiments, a portion of the second wavelength conversion pattern 220 may also overlap the light blocking area BA, unlike that illustrated in the drawings.

In some embodiments, the second wavelength conversion pattern 220 may directly contact the second capping layer 180 and the bank pattern 190.

The second wavelength conversion pattern 220 may convert or shift a peak wavelength of the incident light to another specific peak wavelength and emit the light. In some embodiments, the second wavelength conversion pattern 220 may convert the emitted light LE, provided from the second light emitting device ED2, into green light having a range of about 510 nm to about 550 nm, and emit the green light.

In some embodiments, the second wavelength conversion pattern 220 may include a second base resin 221 and second wavelength shifters 223 dispersed in the second base resin 221, and may further include second scatterers 225 dispersed in the second base resin 221.

The second base resin 221 may be made of a material having high light transmittance. In some embodiments, the second base resin 221 may be made of an organic material. In some embodiments, the second base resin 221 and the third base resin 231 may be made of a same material, or the second base resin 221 may include at least one of the materials that may be used to form the third base resin 231, e.g., as discussed herein.

The second wavelength shifter 223 may convert or shift the peak wavelength of the incident light to another specific peak wavelength. In some embodiments, the second wavelength shifter 223 may convert blue light, having a peak wavelength in a range of about 440 nm to about 480 nm, into green light having a peak wavelength in a range of about 510 nm to about 550 nm.

The second wavelength shifter 223 may be, for example, a quantum dot, a quantum bar, or a phosphor. A more detailed description of the second wavelength shifter 223 is substantially the same as or similar to the description of the first wavelength shifter 213, and thus will be omitted.

In some embodiments, both the first wavelength shifter 213 and the second wavelength shifter 223 may be formed of quantum dots. In this case, a particle size of the quantum dots constituting the second wavelength shifter 223 may be smaller than a particle size of the quantum dots constituting the first wavelength shifter 213.

The second scatterer 225 and the second base resin 221 may have different refractive indices, and the second scatterer 225 may form an optical interface with the second base resin 221. For example, the second scatterers 225 may be light scattering particles. Other detailed descriptions of the second scatterers 225 are substantially the same as or similar to those of the first scatterers 215, and thus will be omitted.

The emitted light LE emitted from the third light emitting device ED3 may be provided to the second wavelength conversion pattern 220, and the second wavelength shifter 223 may convert the emitted light LE, provided from the third light emitting device ED3, into green light having a peak wavelength in a range of about 510 nm to about 550 nm and emit the green light.

A portion of the emitted light LE, which is the blue light, may be transmitted through the second wavelength conversion pattern 220 without being converted into the green light by the second wavelength shifter 223, which may be blocked by the color filter 270. On the other hand, the green light of the emitted light LE converted by the second wavelength conversion pattern 220 is transmitted through the color filter 270 and is emitted to the outside. Accordingly, the second light L2 emitted to the outside of the display device 1 in the second light transmitting area TA2 may be the green light.

An inorganic insulating layer 240 and a first organic insulating layer 250 may be disposed on the wavelength conversion patterns 210 and 220 and the light transmission pattern 230. The inorganic insulating layer 240 may directly contact top surfaces of the wavelength conversion patterns 210 and 220 and the light transmission pattern 230 and a top surface of the bank pattern 190, and may directly contact the first organic insulating layer 250. The inorganic insulating layer 240 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like. In an embodiment, the inorganic insulating layer 240 may include silicon nitride.

The first organic insulating layer 250 may include a first base material 251 and first fillers 255 dispersed in the first base material 251. The first base material 251 may include Chemical Formula 1, Chemical Formula 2, or Chemical Formula 3 below. Here, Y may be O, NR, or $(SiO_{2/3}R)_{4+2n}O$ (where n is an integer greater than or equal to 0), and R may be H, F, or CPHQ (where P and Q are each a natural number). Y' may be at least one of the materials of Y. For example, Y and Y' may be different from each other, but may be the same.

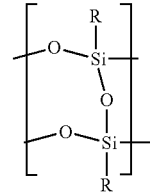

[Chemical Formula 1]

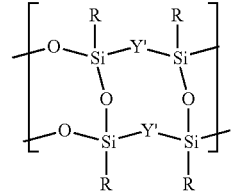

[Chemical Formula 2]

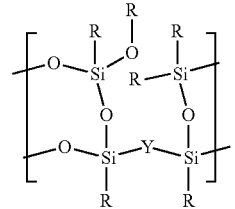

[Chemical Formula 3]

The first filler 255 may include a hollow silica, a hollow acrylate polymer, a hollow vinyl polymer, a hollow epoxy polymer, or $TiO_2$. The first filler 255 may have a circular shape, for example. However, the shape of the first filler 255 is not limited thereto, and the shape of the first filler 255 may be an ellipse or other polygonal shape. Hereinafter, a case in which the shapes of the first fillers 255 and second fillers 285 to be described below are circular will be mainly described.

A size (e.g., a diameter W1 in the case of a circular shape) of the first filler 255 may be smaller than a size W2 of the second filler 285 to be described below. For example, the diameter W1 of the first filler 255 may be about 50 nm to about 500 nm. The diameter W1 of the first filler 255 may be set in consideration of a thickness T1 of the first organic insulating layer 250. The thickness T1 of the first organic insulating layer 250 may be about 100 nm to about 500 nm. By setting the thickness T1 of the first organic insulating layer 250 to about 100 nm or more, total reflection at an interface between the inorganic insulating layer 240 and the first organic insulating layer 250 through a design of the refractive indices of the inorganic insulating layer 240 and the first organic insulating layer 250 to be described below may well occur. By setting the thickness T1 of the first organic insulating layer 250 to be smaller than about 500 nm, it is possible to reduce the cost of material of the first organic insulating layer and increase the transmission efficiency of light L1, L2, and L3. The first filler 255 may be designed to have a diameter W1 of about 500 nm or less, which is smaller than an upper limit of the thickness T1 of the first organic insulating layer 250, and may have a diameter W1 of about 50 nm or more, thereby reducing the refractive index of the first organic insulating layer 250.

Since the first organic insulating layer 250 includes the first fillers 255, the refractive index of the first organic insulating layer 250 may be designed to be lower than that of the inorganic insulating layer 240. For example, the refractive index of the first organic insulating layer 250 may be about 1.3 to about 1.8, and the refractive index of the inorganic insulating layer 240 may be about 1.9 to about 2.2. As a result, the light (third light L3) that is not converted into first light L1 and second light L2, by the first and second wavelength conversion patterns 210 and 220 among the light transmitted through the inorganic insulating layer 240 in the first and second light transmitting areas TA1 and TA2 may be totally reflected at the interface between the inorganic insulating layer 240 and the first organic insulating layer 250. As a result, light efficiency of the display device 1 may be improved.

Color filter layers 260 and 270 may be disposed on the first organic insulating layer 250. The color filter layers 260 and 270 may include a light blocking pattern 260 and a color filter 270 overlapping the light blocking area BA. The light blocking pattern 260 may be directly disposed on the first organic insulating layer 250 in the light blocking area BA. The light blocking pattern 260 may be disposed between the first to third light transmitting areas TA1, TA2, and TA3 to prevent light mixing. As illustrated in FIG. 12, the light blocking pattern 260 may surround the first to third light transmitting areas TA1, TA2, and TA3 in a plan view.

The color filter 270 may be disposed on the light blocking pattern 260 overlapping the light blocking area BA. Since the color filter 270 is formed after the light blocking pattern 260 is formed, the light blocking pattern 260 and the color filter 270 are positioned on different layers, but may constitute a color filter layer.

The color filter 270 may be disposed in the light blocking area BA and the first and second light transmitting areas TA1 and TA2 as illustrated in FIGS. 7 and 11. The color filter 270 may not be disposed in the third light transmitting area TA3. The color filter 270 may also contact a top surface of the light blocking pattern 260.

The color filter 270 may block or absorb the third light L3 (e.g., blue light). For example, the color filter 270 may function as a blue light blocking filter that blocks the blue light. In some embodiments, the color filter 270 may selectively transmit the light (L1), e.g., red light, of the first color and the light (L2), e.g., green light, of the second color, and may block or absorb the light (L3), e.g., blue light, of the third color. For example, the color filter 270 may be a yellow color filter and may include a red colorant and a green colorant. Since the yellow color filter is widely known in the art, a detailed description thereof will be omitted.

A second organic insulating layer 280 may be disposed on the color filter 270. The second organic insulating layer 280 may include a second base material 281 and second fillers 285 dispersed in the second base material 281. The second base material 281 may include at least one of Chemical Formulas 1 to 3 of the first base material 251. For example, the second base material 281 and the first base material 251 may include a same material.

The second filler 285 may include a hollow silica, a hollow acrylate polymer, a hollow vinyl polymer, a hollow epoxy polymer, or $TiO_2$. The second filler 285 and the above-described first filler 255 may have a same shape.

A size (e.g., a diameter W2 in the case of a circular shape) of the second filler 285 may be larger than the size W1 of the first filler 255 described above. For example, the diameter W2 of the second filler 285 may be about 50 nm to about 6000 nm. The diameter W2 of the second filler 285 may be set in consideration of film characteristics of the second organic insulating layer 280.

First, the second organic insulating layer 280 may be disposed on the color filter 270 in the first and second light transmitting areas TA1 and TA2 and the light blocking area BA to directly contact the color filter 270, and may directly contact the first organic insulating layer 250 in the third light transmitting area TA3. The second organic insulating layer 280 directly contacting the first organic insulating layer 250 may also contact a side surface of the light blocking pattern 260 and a side surface of the color filter 270, respectively. For example, a thickness T2b of the second organic insulating layer 280 in the third light transmitting area TA3 may be greater than a thickness T2a of the second organic insulating layer 280 in the first and second light transmitting areas TA1 and TA2.

The thickness T2a of the second organic insulating layer 280 in the first and second light transmitting areas TA1 and TA2 may be about 3000 nm to about 10000 nm. By setting the thickness T2a of the second organic insulating layer 280 to about 3000 nm or more, a planarization function may be easily performed, and by setting the thickness T2a to about 10000 nm or less, light loss may be minimized.

Since the diameter W2 of the second filler 285 is about 50 nm or more, cracks may be formed inside the second organic insulating layer 280 to lower external light reflectance of the second organic insulating layer 280 (see FIG. 8). For example, in case that the cracks occur inside the second organic insulating layer 280 by the second fillers 285 and external light is provided to the second organic insulating layer 280, internal scattering may be greatly increased due to the cracks occurred inside the second organic insulating layer 280, and thus external light reflectance may be greatly reduced. Furthermore, in case that the diameter W2 of the second filler 285 is greater than the thickness T2a of the second organic insulating layer 280, the second filler 285 may protrude from a surface of the second organic insulating layer 280. Portions of the second fillers 285 protruding from the surface of the second organic insulating layer 280 may induce scattering of the external light on the surface of the second organic insulating layer 280 to lower the external light reflectance.

The first and second fillers 255 and 285 may have a content of about 50 wt % or less in the first and second organic insulating layers 250 and 280, respectively, but are not limited thereto.

In some embodiments, the first base material 251 and the second base material 281 may include different materials. In case that R in Formulas 1 to 3, which are examples of the first base material 251, is F, the refractive index may be lower than that in case that R is H. As described above, since the first organic insulating layer 250 is disposed on the inorganic insulating layer 240 and the total reflection effect is improved as the difference in refractive index between the inorganic insulating layer 240 and the first organic insulating layer 250 increases, the first base material 251 according to some embodiments may be designed such that R includes F, and the second base material 281 may be designed such that R includes H.

The thickness T1 of the first organic insulating layer 250 may be about 100 nm to about 500 nm. By setting the thickness T1 of the first organic insulating layer 250 to about 100 nm or more, total reflection at an interface between the inorganic insulating layer 240 and the first organic insulating layer 250 through a design of the refractive indices of the inorganic insulating layer 240 and the first organic insulating layer 250 to be described below may occur. By setting the thickness T1 of the first organic insulating layer 250 to be smaller than about 500 nm, it is possible to reduce the cost of material of the first organic insulating layer material and increase the transmission efficiency of the light L1, L2, and L3. The first filler 255 may be designed to have a diameter W2 of about 500 nm or less, which is smaller than an upper limit of the thickness T1 of the first organic insulating layer 250, and have a diameter W1 of about 50 nm or more, thereby reducing the refractive index of the first organic insulating layer 250.

Since the first organic insulating layer 250 includes the first fillers 255, the refractive index of the first organic insulating layer 250 may be designed to be lower than that of the inorganic insulating layer 240. For example, the refractive index of the first organic insulating layer 250 may be about 1.3 to about 1.8, and the refractive index of the inorganic insulating layer 240 may be about 1.9 to about 2.2. As a result, the light (third light L3) that is not converted into the first light L1 and the second light L2 by the first and second wavelength conversion patterns 210 and 220 among the light transmitted through the inorganic layer 240 in the first and second light transmitting areas TA1 and TA2 may be totally reflected at the interface between the inorganic insulating layer 240 and the first organic insulating layer 250. As a result, light efficiency of the display device 1 may be improved.

Hereinafter, other embodiments will be described.

Figure 15:
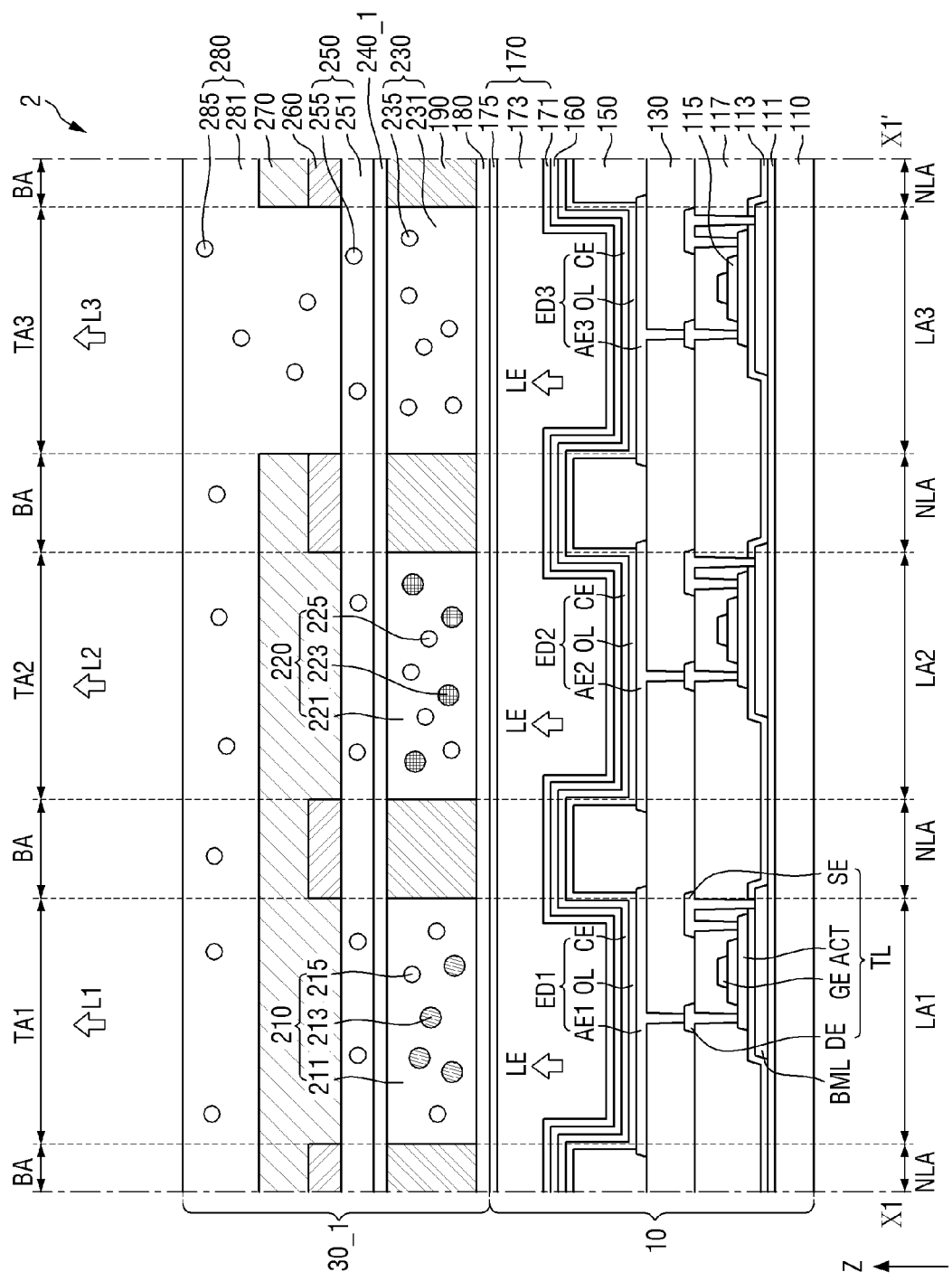
FIG. 15 is a schematic cross-sectional view of a display device according to another example embodiment.

FIG. 15 is a schematic cross-sectional view of a display device according to another embodiment.

Referring to FIG. 15, a display device 2 according to the embodiment is different from the display device 1 according to FIG. 7 at least in that an inorganic insulating layer 240_1 of a color conversion portion 30_1 thereof includes silicon oxynitride. Typically, silicon oxynitride may have a higher refractive index than silicon nitride. However, a refractive index of the inorganic insulating layer 240_1 may be designed to be greater than that of the first organic insulating layer 250. Since other descriptions have been made with reference to FIGS. 1 to 14, detailed descriptions thereof will be omitted.

Figure 16:
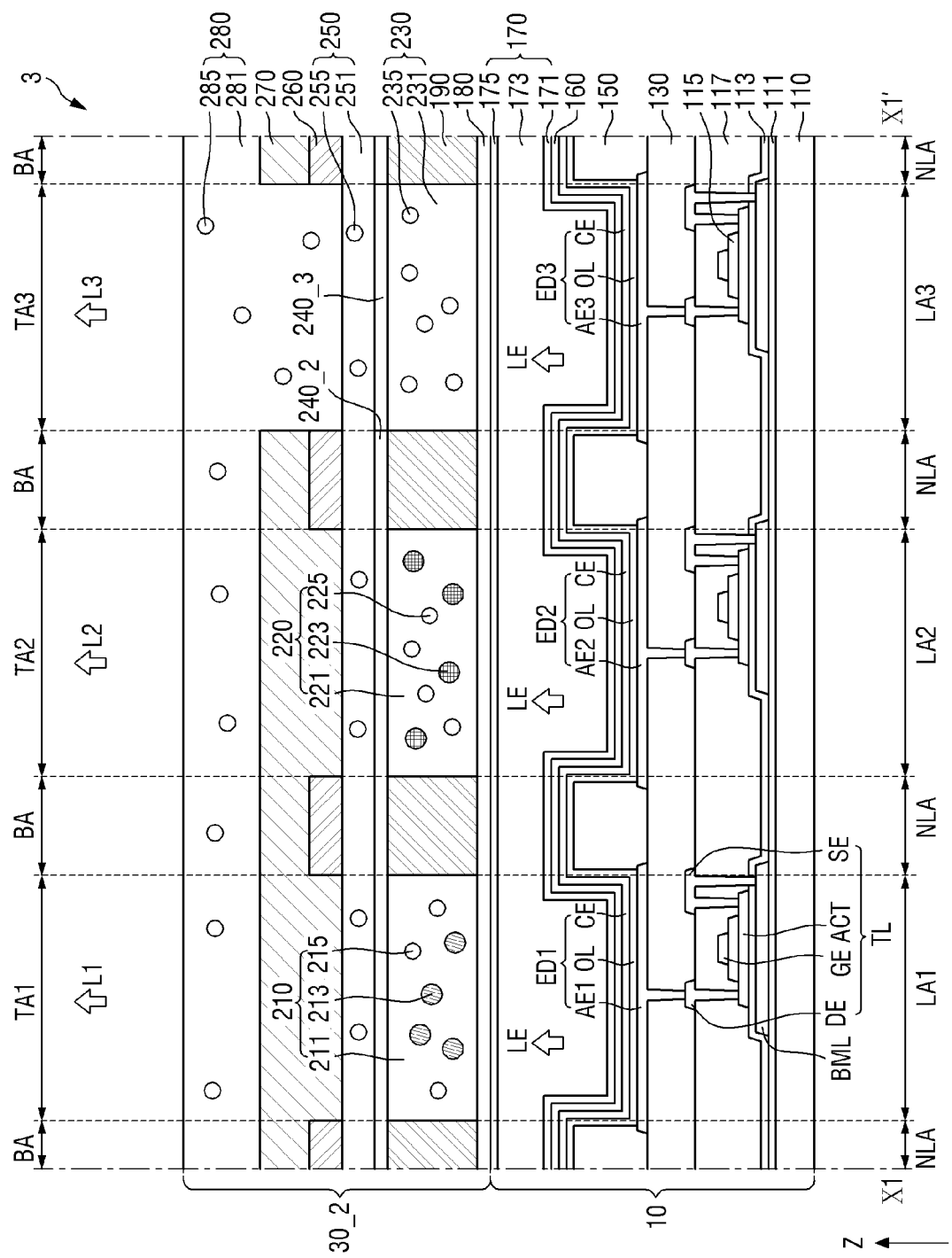
FIG. 16 is a schematic cross-sectional view of a display device according to still another example embodiment.

FIG. 16 is a schematic cross-sectional view of a display device according to still another embodiment.

Referring to FIG. 16, a display device 3 according to the present embodiment is different from the display device 1 according to FIG. 7 at least in that inorganic insulating layers 240_2 and 240_3 of a color conversion portion 30_2 include different materials.

More specifically, a first portion 240_2 having the same material as the inorganic insulating layer 240 described above with reference to FIG. 7 may be disposed in the remaining area except for the third light transmitting area TA3, and a second portion 240_3 different from the first portion 240_2 may be disposed in the third light transmitting area TA3. The second portion 240_3 may have a lower refractive index than the first portion 240_2. For example, the second portion 240_3 may include silicon oxynitride.

According to the embodiment, the second portion 240_3 having the lower refractive index than the first portion 240_2 is applied to the third light transmitting area TA3, and as a result, a difference in refractive index between the second portion 240_3 and the first organic insulating layer 250 may be smaller than a difference in refractive index between the first portion 240_2 and the first organic insulating layer 250.

As described above in FIG. 7, the purpose is to increase the total reflection efficiency in the first and second light transmitting areas TA1 and TA2 through a design of the difference in refractive index between the inorganic insulating layer 240 and the first organic insulating layer 250, and in the case of the third light transmitting area TA3, the light efficiency may be reduced due to the design of the difference in refractive index. However, as in the embodiment, by selectively applying the second portion 240_3, having a lower refractive index than that of the first portion 240_2, to the third light transmitting area TA3 and as a result, by designing the difference in refractive index between the second portion 240_3 and the first organic insulating layer 250 to be smaller than the difference in refractive index between the first portion 240_2 and the first organic insulating layer 250, there is an advantage at least in that light efficiency in the third light transmitting area TA3 may be increased.

Figure 17:
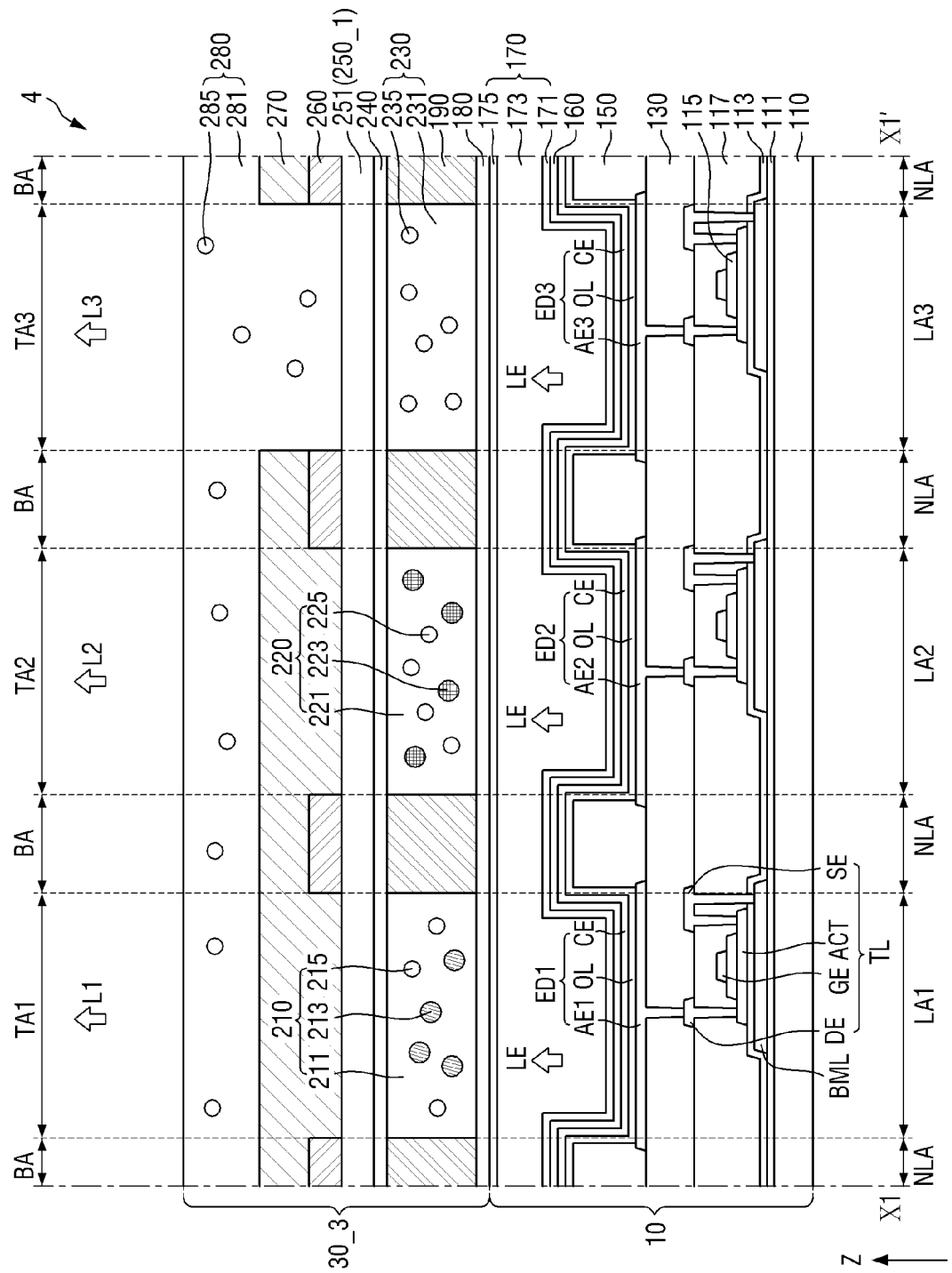
FIG. 17 is a schematic cross-sectional view of a display device according to still another example embodiment.

FIG. 17 is a schematic cross-sectional view of a display device according to still another embodiment.

Referring to FIG. 17, a display device 4 according to the embodiment is different from the display device 1 according to FIG. 7 at least in that a first organic insulating layer 250_1 of a color conversion portion 30_3 thereof does not include a first filler.

As described above, the purpose of the first organic insulating layer 250_1 is to increase the total reflection efficiency by increasing a difference in refractive index with the inorganic insulating layer 240 on a lower side thereof, and in the case of the embodiment in which the first base material 251 described above with reference to FIG. 7 and the second base material 281 include different materials (in the first base material 251, R includes F), there is an advantage that the first filler may be omitted.

Since other descriptions have been made with reference to FIG. 7, detailed descriptions thereof will be omitted.

Figure 18:
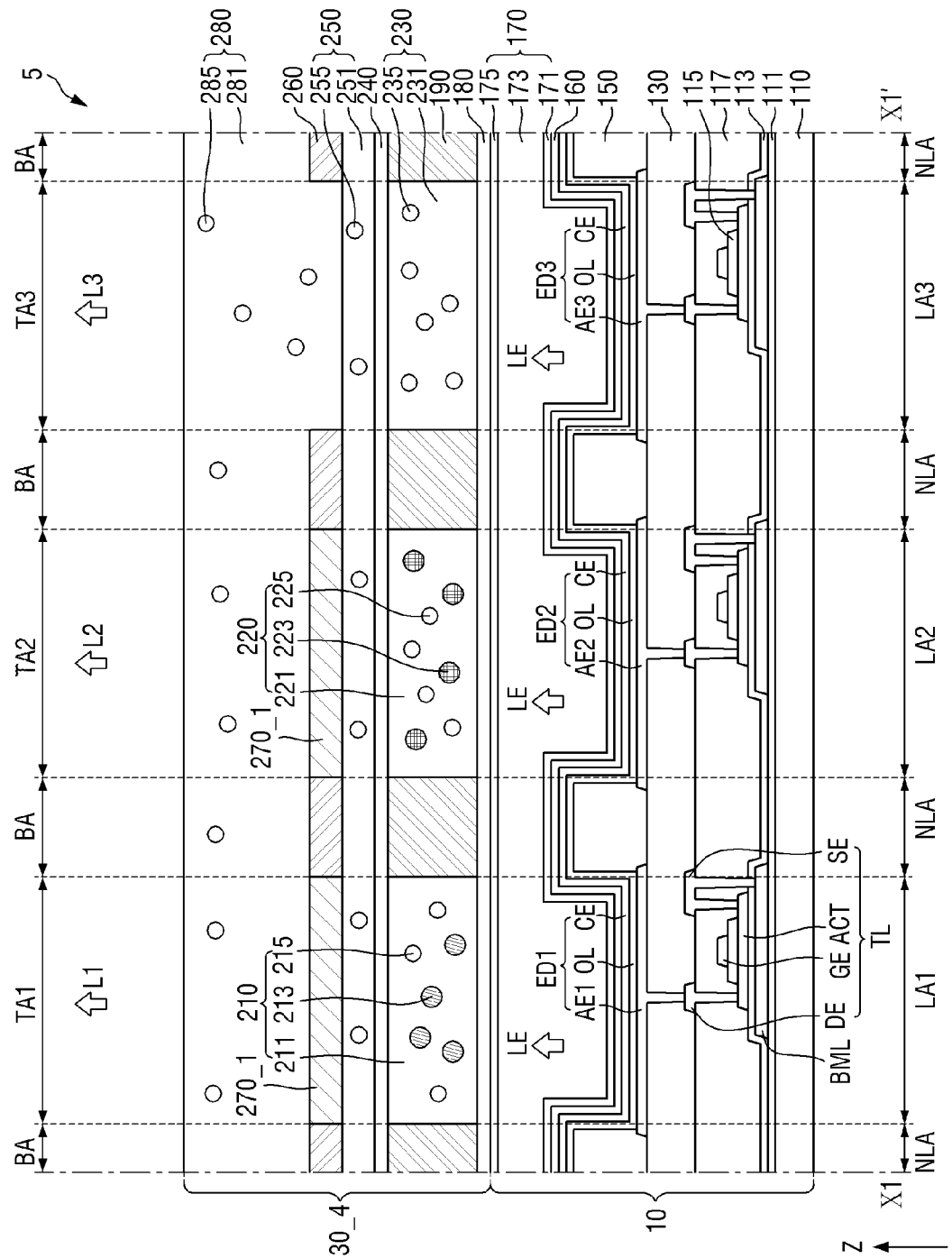
FIG. 18 is a schematic cross-sectional view of a display device according to still another example embodiment.

FIG. 18 is a schematic cross-sectional view of a display device according to still another embodiment.

Referring to FIG. 18, a display device 5 according to the embodiment is different from the display device 1 according to FIG. 7 at least in that a color filter 270_1 of a color conversion portion 30_4 thereof does not overlap the light blocking area BA. More specifically, the color filter 270_1 may not contact the top surface of the light blocking pattern 260. The color filter 270_1 may be disposed only on the first and second light transmitting areas TA1 and TA2.

Since other descriptions have been made with reference to FIG. 7, detailed descriptions thereof will be omitted.

Figure 19:
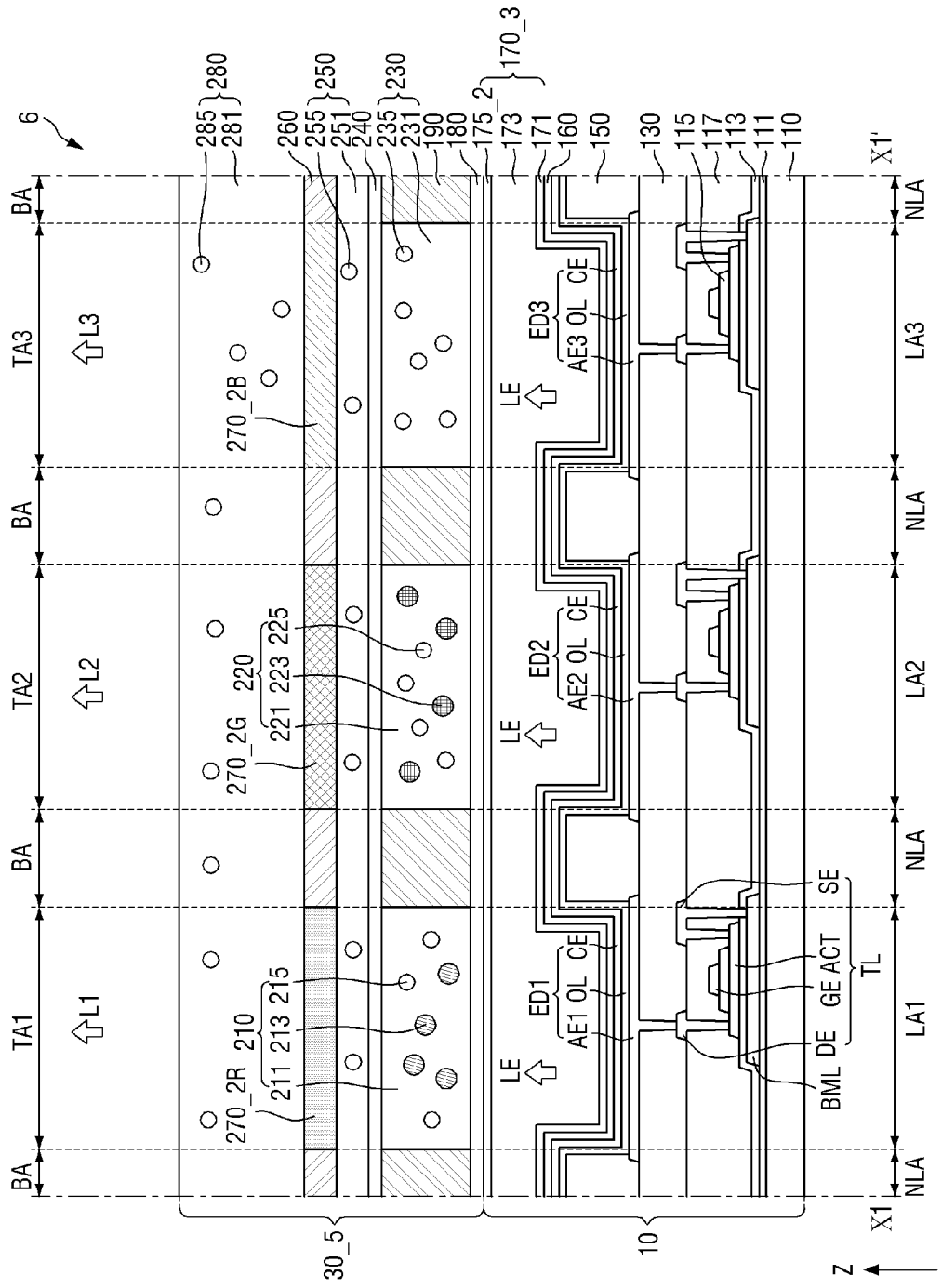
FIG. 19 is a schematic cross-sectional view of a display device according to still another example embodiment.

FIG. 19 is a schematic cross-sectional view of a display device according to still another embodiment.

Referring to FIG. 19, a display device 6 according to the embodiment is different from the display device 1 according to FIG. 7 at least in that a color filter layer of a color conversion portion 30_5 includes first to third color filters 270_2R, 270_2G, and 270_2B. The first color filter 270_R may be disposed in the first light transmitting area TA1, the second color filter 270_G may be disposed in the second light transmitting area TA2, and the third color filter 270_B may be disposed in the third light transmitting area TA3.

The first color filter 270_R may selectively transmit the light L1 of the first color (e.g., red light) and block or absorb the light L2 and L3 of the second color and the third color, the second color filter 270_G may selectively transmit the light L2 of the second color (e.g., green light) and block or absorb the light L1 and L3 of the first color and the third color, and the third color filter 270_B may selectively transmit the light L3 of the third color (e.g., blue light) and block or absorb the light L1 and L2 of the first color and the second color.

Since other descriptions have been made with reference to FIG. 7, detailed descriptions thereof will be omitted.

More specifically, an encapsulation layer 170_3 according to the embodiment may include a lower inorganic layer 171, an organic layer 173, and an upper inorganic layer 175_2. Since the upper inorganic layer 175_2 has been described above with reference to FIG. 7, repeated descriptions thereof will be omitted.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display portion including:
a non-light emitting area; and
a light emitting area adjacent to the non-light emitting area; and
a color conversion portion disposed on the display portion, wherein
the display portion includes:
a base portion, and
a light emitting device disposed on the base portion in the light emitting area,
the color conversion portion includes:
wavelength conversion patterns disposed on the light emitting device,
an inorganic insulating layer disposed on the wavelength conversion patterns,
a first organic insulating layer disposed on the inorganic insulating layer,
a color filter layer disposed on the first organic insulating layer, and
a second organic insulating layer disposed on the color filter layer,
the inorganic insulating layer is between the wavelength conversion patterns and the first organic insulating layer,
the first organic insulating layer is between the inorganic insulating layer and the color filter layer,
the color filter layer is between the first organic insulating layer and the second organic insulating layer, and
a portion of the second organic insulating layer overlapping a portion of the light emitting area has a first thickness greater than a second thickness of another portion of the second organic insulating layer overlapping another portion of the light emitting area.

2. The display device of claim 1, wherein the inorganic insulating layer has a refractive index greater than a refractive index of the first organic insulating layer.

3. The display device of claim 2, wherein the refractive index of the inorganic insulating layer is in a range of about 1.9 to about 2.2.

4. The display device of claim 2, wherein the refractive index of the first organic insulating layer is in a range of about 1.3 to about 1.8.

5. The display device of claim 1, wherein the second organic insulating layer has a thickness greater than a thickness of the first organic insulating layer.

6. The display device of claim 5, wherein
the thickness of the first organic insulating layer is in a range of about 100 nm to about 500 nm, and
the thickness of the second organic insulating layer is in a range of about 3000 nm to about 10000 nm.

7. The display device of claim 6, wherein
the first organic insulating layer includes a first base material, and
the second organic insulating layer includes a second base material.

8. The display device of claim 7, wherein the first base material and the second base material each includes:

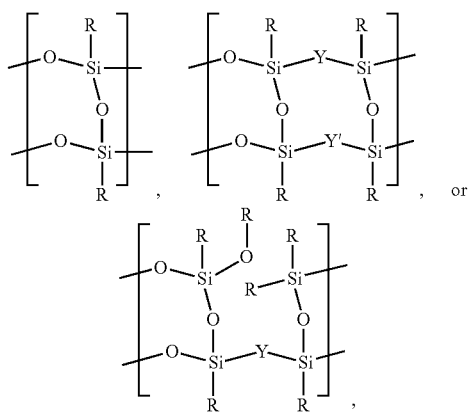

where Y and Y' can independently be O, NR, or $(SiO_{2/3}R)_{4+2n}O$, n being an integer greater than or equal to 0, and
R is H or F.

9. The display device of claim 8, wherein the first base material and the second base material include a same material.

10. The display device of claim 8, wherein
the first base material and the second base material are different,
R of the first base material is F, and
R of the second base material is H.

11. The display device of claim 7, wherein
the first organic insulating layer includes a first filler,
the second organic insulating layer includes a second filler, and
the first filler and the second filler each include at least one of a hollow silica, a hollow acrylate polymer, a hollow vinyl polymer, a hollow epoxy polymer, and $TiO_2$.

12. The display device of claim 11, wherein the second filler has a size larger than a size of the first filler.

13. The display device of claim 12, wherein
the second filler has a diameter in a range of about 50 nm to about 6000 nm, and
the first filler has a diameter in a range of about 50 nm to about 500 nm.

14. The display device of claim 11, wherein the first filler and the second filler each have a content of 50 wt % or less.

15. A display device comprising:
a display portion including:
  a non-light emitting area; and
  light emitting areas adjacent to the non-light emitting area, the light emitting areas including a first light emitting area, a second light emitting area, and a third light emitting area; and
a color conversion portion disposed on the display portion, wherein
the display portion includes:
  a base portion, and
  a light emitting device disposed on the base portion in the light emitting areas, and
the color conversion portion includes:
  a first wavelength conversion pattern overlapping the first light emitting area in a plan view;
  a second wavelength conversion pattern overlapping the second light emitting area in a plan view;
  a light transmission pattern overlapping the third light emitting area in a plan view;
  a first inorganic insulating layer disposed on the first wavelength conversion pattern, the second wavelength conversion pattern, and the light transmission pattern;
  a first organic insulating layer disposed on the first inorganic insulating layer;
  a color filter layer disposed on the first organic insulating layer; and
  a second organic insulating layer disposed on the color filter layer;
the first inorganic insulating layer has a refractive index greater than a refractive index of the first organic insulating layer,
the first wavelength conversion pattern, the second wavelength conversion pattern, and the light transmission pattern are disposed on the light emitting device,
the first inorganic insulating layer is between the first wavelength conversion pattern and the first organic insulating layer and is between the second wavelength conversion pattern and the first organic insulating layer,
the first organic insulating layer is between the first inorganic insulating layer and the color filter layer,
the color filter layer is between the first organic insulating layer and the second organic insulating layer, and
a thickness of the second organic insulating layer overlapping the third light emitting area is greater than a thickness of the second organic insulating layer overlapping the first and second light emitting areas.

16. The display device of claim 15, wherein the color filter layer includes a yellow color filter.

17. The display device of claim 16, wherein the yellow color filter does not overlap the third light emitting area in a plan view.

18. The display device of claim 17, wherein the second organic insulating layer directly contacts the first organic insulating layer in an area overlapping the third light emitting area in a plan view.

19. The display device of claim 15, further comprising:
a second inorganic insulating layer, wherein
the first inorganic insulating layer does not overlap the third light emitting area in a plan view,
the second inorganic insulating layer in an area overlapping the third light emitting area is disposed on a same layer as the first inorganic insulating layer in another area, and
the second inorganic insulating layer has a refractive index smaller than a refractive index of the first inorganic insulating layer.

* * * * *